(12) United States Patent
Kim et al.

(10) Patent No.: US 9,349,780 B2
(45) Date of Patent: May 24, 2016

(54) TRANSPARENT ORGANIC LIGHT EMITTING DISPLAY DEVICE AND METHOD FOR MANUFACTURING THE SAME

(71) Applicant: LG Display Co., Ltd., Seoul (KR)

(72) Inventors: YongChul Kim, Paju-si (KR); Jonghyeok Im, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/095,915

(22) Filed: Dec. 3, 2013

(65) Prior Publication Data

US 2014/0183472 A1   Jul. 3, 2014

(30) Foreign Application Priority Data

Dec. 27, 2012   (KR) .................. 10-2012-0155590

(51) Int. Cl.
    *H01L 27/32*   (2006.01)
(52) U.S. Cl.
    CPC .......... *H01L 27/3258* (2013.01); *H01L 27/326* (2013.01); *H01L 2251/5323* (2013.01)
(58) Field of Classification Search
    CPC .................... H01L 27/3258; H01L 27/326
    USPC .............. 257/40, 57, 66, 98, 347; 438/34, 151
    See application file for complete search history.

(56) References Cited

U.S. PATENT DOCUMENTS

| | | | |
|---|---|---|---|
| 7,476,908 B2* | 1/2009 | Yamazaki et al. | ............. 257/93 |
| 7,659,661 B2 | 2/2010 | Park | |
| 8,274,090 B2 | 9/2012 | Choi et al. | |
| 8,378,352 B2 | 2/2013 | Lee et al. | |
| 8,638,030 B2 | 1/2014 | Lee et al. | |
| 2005/0062057 A1* | 3/2005 | Yamazaki et al. | ............. 257/98 |
| 2007/0013629 A1* | 1/2007 | Matsumoto | ................... 345/92 |
| 2007/0188085 A1* | 8/2007 | Young | ......................... 313/506 |
| 2009/0146930 A1* | 6/2009 | Nishimura et al. | ............. 345/80 |
| 2009/0251775 A1 | 10/2009 | Jung et al. | |
| 2010/0148155 A1* | 6/2010 | Choi et al. | ..................... 257/40 |
| 2011/0062433 A1* | 3/2011 | Yamazaki | ...................... 257/43 |
| 2011/0159619 A1* | 6/2011 | Tsuji et al. | ..................... 438/30 |

(Continued)

FOREIGN PATENT DOCUMENTS

| | | |
|---|---|---|
| JP | 2006-147561 A | 6/2006 |
| KR | 10-2011-0080386 A | 7/2011 |

(Continued)

OTHER PUBLICATIONS

International Search Report and Written Opinion for PCT/KR2013/012084, Apr. 11, 2014, 3 Pages.

*Primary Examiner* — Sheng Zhu

(74) *Attorney, Agent, or Firm* — Fenwick & West LLP

(57) ABSTRACT

A transparent organic light emitting display device and a method of manufacturing the transparent organic light emitting display device are provided. The transparent organic light emitting display device comprises a plurality of sub pixel regions, each having a emissive area and a transmissive area, a thin film transistor disposed in the emissive area, and an organic light emitting element electrically connected to the thin film transistor. While the emissive area emits light to display image on the display device, the transmissive area allows the external light to be passed through the display device so that objects behind the display device can be viewed simultaneously with the displayed image.

15 Claims, 18 Drawing Sheets

(56) References Cited

U.S. PATENT DOCUMENTS

2013/0256668 A1* 10/2013 Oh et al. .................. 257/59
2013/0302939 A1* 11/2013 Liu et al. ................. 438/104

FOREIGN PATENT DOCUMENTS

| KR | 10-2012-0019025 A | 3/2012 |
| KR | 10-2012-0035419 A | 4/2012 |

\* cited by examiner (a)

(b)

TRANSPARENT ORGANIC LIGHT EMITTING DISPLAY DEVICE AND METHOD FOR MANUFACTURING THE SAME

CROSS-REFERENCE TO RELATED APPLICATION

This application claims priority under 35 U.S.C. §119 to Korean Patent Application No. 10-2012-0155590 filed on Dec. 27, 2012, the disclosure of which is hereby incorporated by reference in its entirety.

BACKGROUND

1. Field of Technology

Embodiments of the inventive concept relate to a transparent organic light emitting display device (OLED) and a method for manufacturing the same, and more particularly, to a transparent organic light emitting display device which improves transmittance and minimizes degradation in luminance and a method for manufacturing the same.

2. Description of Related Art

Organic light emitting display devices are self-emissive display devices, and may be manufactured to be lightweight and thin without a separate light source unlike liquid crystal display devices (LCDs). Further, the organic light emitting display devices are advantageous in terms of power consumption due to low-power driving, have good color realization, response speed, a view angle, and a contrast ratio, and have been researched as next-generation displays.

Attempts to manufacture the organic light emitting display devices as transparent display devices have been made. The transparent organic light emitting display devices are organic light emitting display devices which can observe objects located at the rear thereof, and include a pixel region which displays an image through emission of organic light emitting elements, and a transmissive region which transmits external light.

SUMMARY

In an aspect, there is provided a transparent organic light emitting display device with improved configurations for increased light transmittance through the transmissive area of each sub pixel. In one embodiment, the transparent organic light emitting display device includes a first substrate with a plurality of sub pixel regions. Each of the sub pixel regions contains an emissive area and a transmissive area. The transparent organic light emitting display device further includes a thin film transistor (TFT) in the emissive area of the sub-pixel and an organic light emitting element electrically connected to the TFT. Also included in the transparent organic light emitting display device is a plurality of insulating layers disposed in the emissive area of the sub pixel region. Here, at least one of the insulating layers is configured such that it is extended from the emissive area into the transmissive area of the sub pixel region. The insulating layer, which is being extended into the transmissive area, has at least some part that has the same refractive index as the first substrate. The same refractive indices between the first substrate and the insulating layer being extended into the transmissive area reduces the total internal reflection at the interface their interface, thereby allowing more external light to pass through the transmissive area.

In some embodiments, the insulating layer that is extended into the transmissive area has a multilayered structure. Not all layers included in the multilayered structure are extended into the transmissive area of the sub pixel region. Instead, at least one layer of the multilayered structure is contained within the emissive area without being extended into the transmissive area while at least one layer of the multilayered structure disposed in the emissive area is extended into the transmissive area.

In some embodiments, the insulating layer that is in both the emissive area as well as the transmissive area is an insulating layer interposed between the TFT and the first substrate. In one embodiment, the insulating layer interposed between the TFT and the first substrate has the multilayered structure, and the TFT has a coplanar structure with an oxide semiconductor layer disposed on the multilayered structure. In this case, the layer of the multilayered structure contacting the oxide semiconductor layer is extended into the transmissive area and does not include silicon nitride. Also, in one embodiment, the TFT with an oxide semiconductor layer disposed on the gate electrode. In this case, the insulating layer that is in both the emissive area as well as the transmissive area is interposed between the gate electrode and the oxide semiconductor of the TFT. The insulating layer interposed between the gate electrode and the oxide semiconductor has a multilayered structure, and the layer in the multilayered structure contacting the oxide semiconductor does not include silicon nitride.

In some embodiments, the transparent organic light emitting display device includes a second substrate opposing the first substrate. The TFT, the organic light emitting element, the plurality of insulating layers and the encapsulating layer are interposed between the first and second substrates. In the transparent organic light emitting display device, the first substrate, the insulating layer being extended into the transmissive area and the second substrate all have substantially the same refractive index with respect to each other. That is, the first and second substrates have substantially the same refractive index as the insulating layer being extended into the transmissive area and the opposing substrate. Likewise, the insulating layer being extended into the transmissive area has substantially the same refractive index as the first and second substrates.

In one aspect, there is provided a transparent organic light emitting display device configured for increased overall light transmittance through the display device.

In one embodiment, the organic light emitting display device includes a substrate having a plurality of sub pixels. Each of the sub pixels has an emissive area for emitting light and a transmissive area for allowing the external light to pass through. The organic light emitting display device also includes one or more thin film transistors, which are formed with a gate electrode, an active layer and source/drain electrodes, operatively coupled to one or more organic light emitting elements. An encapsulation layer is included in the organic light emitting display device to protect the organic light emitting elements and/or the TFT from the permeation of moisture and air. Also included in the organic light emitting display device is a plurality of insulating layers, including a first, a second and a third insulating layers. The first insulating layer is interposed between the substrate and the TFT; the second insulating layer is interposed between the gate electrode and the active layer of the TFT; and the third insulating layer is disposed on the TFT. Among the first, second and third insulating layers, at least one insulating layer has a refractive index that is different from the refractive index of the substrate by more than a predetermined value.

In some embodiments, at least one insulating layer among the first, second and the third insulating layers has substantially the same refractive index as the substrate. Also in some embodiments, at least one of the first, second and the third insulating layers has a multilayered structure including at least one layer that has substantially the same refractive index as the substrate and at least one layer with a refractive index differing from the substrate by more than the predetermined threshold value. In such embodiments, the layer of the multilayered structure having the refractive index different from that of the substrate is contained within the emissive area of the sub pixel.

In yet another aspect of the present disclosure is related to a method of manufacturing a transparent organic light emitting display device that includes a plurality of sub pixels, each sub-pixel including an emissive area and a transmissive area. In an embodiment, the method includes forming a buffer layer on a first substrate; forming an active layer on the buffer layer; forming a gate insulating layer on the active layer; forming a plurality of electrodes on the active layer, the plurality of electrodes including a source electrode, a drain electrode, and a gate electrode electrically insulated from each other by an interlayer insulating layer; forming an overcoating layer over the emissive area and the transmissive area of the transparent organic light emitting display device; and forming an organic light emitting element on the overcoating layer in the emissive area.

In some embodiments, the buffer layer is formed as a multilayered structure including a first buffer layer and a second buffer layer. The first buffer layer, which includes of silicon nitride, is formed in the emissive area without being extended into the transmissive area. In contrast, the second buffer layer, which includes of silicon oxide, is formed to contact the active layer, and extended into the transmissive area.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1A:
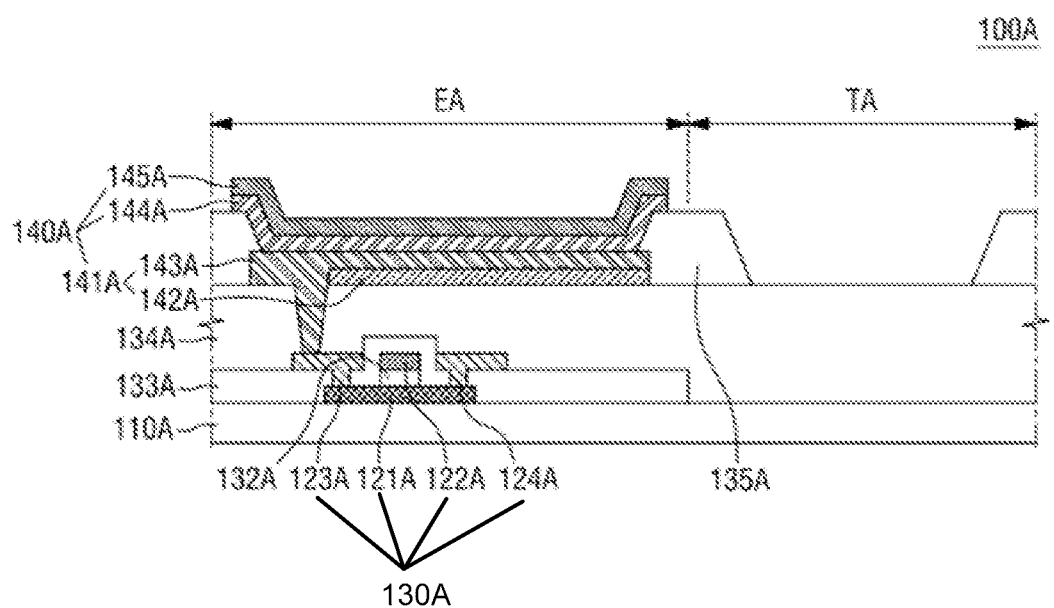
FIGS. 1A to 1D are cross-sectional views illustrating transparent organic light emitting display devices in accordance with various embodiments of the inventive concept.

Exemplary embodiments of the present invention will be described in detail below with reference to the accompanying drawings. While the present invention is shown and described in connection with exemplary embodiments thereof, it will be apparent to those skilled in the art that various modifications can be made without departing from the scope of the invention.

An element or layer formed "on" another element or layer includes all a case in which an element is directly formed on another element, and a case in which an element is formed on another element with an additional element or layer formed therebetween.

Although the terms first, second, etc. may be used to describe various elements, it should be understood that these elements are not limited by these terms. These terms are only used to distinguish one element from another. For example, a first element could be termed a second element, and, similarly, a second element could be termed a first element, without departing from the scope of exemplary embodiments.

In this specification, like numbers refer to like elements throughout the description of the drawings.

Sizes and thicknesses of respective elements shown in the drawings are shown for the sake of convenience of description only and are not intended to limit the scope of the present invention.

In this specification, an organic light emitting display device with a top emission mode refers to an organic light emitting display device, wherein light emitted from the organic light emitting diode radiates from an upper portion of the organic light emitting display device. That is, the organic light emitting display device with a top emission mode refers to an organic light emitting display device, wherein light emitted from the organic light emitting diode radiates in a direction of a top surface of a substrate having a thin film transistor formed therein for driving the organic light emitting display device. In this specification, an organic light emitting display device with a bottom emission mode refers to an organic light emitting display device, wherein light emitted from the organic light emitting diode radiates from a lower portion of the organic light emitting display device. That is, the organic light emitting display device with a bottom emission mode refers to an organic light emitting display device, wherein light emitted from the organic light emitting diode radiates in a direction of a bottom surface of a substrate having a thin film transistor formed therein for driving the organic light emitting display device. In this specification, an organic light emitting display device with a dual emission mode refers to an organic light emitting display device, wherein light emitted from the organic light emitting diode radiates from upper and lower portions of the organic light emitting display device. In this specification, in the organic light emitting display devices with top, bottom, and dual emission modes, a thin film transistor, an anode, and a cathode are disposed to optimize a configuration of each emission mode, thereby optimally disposing the thin film transistor without interfering with an emission direction of a light emitting element.

In this specification, a flexible display device refers to a display device endowed with flexibility, and may be used to have the same meaning as a bendable display device, a rollable display device, an unbreakable display device, or a foldable display device. In this specification, a flexible organic light emitting display device is one example of various flexible display devices.

In this specification, a transparent display device refers to a transparent display device that is at least a part of a screen of a display device viewed by a user. In this specification, transparency of the transparent display device refers to a degree of transparency at which a user at least recognizes an object behind a display device. In this specification, the transparent display device includes a display area and a non-display area. The display area is an area on which an image is displayed, and the non-display area is an area on which no image is displayed, such as a bezel area. To maximize transmittance of the display area, the transparent display device is configured to dispose opaque components, such as a battery, a printed circuit board (PCB), and a metal frame, under the non-display area rather than the display area.

In this specification, front and rear surfaces of the transparent display device are defined based on light emitted from the transparent display device. In this specification, the front surface of the transparent display device means a surface on which light from the transparent display device is emitted, and the rear surface of the transparent display device means a surface opposite to the surface on which the light from the transparent display device is emitted.

The features of various exemplary embodiments of the present invention may be partially or entirely bound or combined with each other, and be technically engaged and driven using various methods as apparent to those skilled in the art, and the exemplary embodiments may be independently practiced alone or in combination.

Hereinafter, various exemplary embodiments of the present invention will be described in further detail with reference to the accompanying drawings.

FIG. 1A is a cross-sectional view illustrating a transparent organic light emitting display device in accordance with an embodiment of the inventive concept. Referring to FIG. 1A, a transparent organic light emitting display device 100A includes a first substrate 110A, a thin film transistor (TFT) 130A, a gate insulating layer 132A, an interlayer insulating layer 133A, an overcoating layer 134A, an organic light emitting element 140A, and a bank layer 135A.

The first substrate 110A is substrates configured to support and protect various elements of the transparent organic light emitting display device 100A. Accordingly, the first substrate 110A is illustrated as being disposed at the bottom of the transparent organic light emitting display device 100A, and may be referred to as a lower substrate, a supporting substrate, a thin film transistor substrate, a lower supporting member, and the likes. The first substrate 110A is made of a transparent insulating material, for example, glass, plastic, and the likes. For purposes of explanations, is the first substrate 110A is described as being a glass substrate in the present disclosure with a refractive index of 1.5. However, it should be appreciated that the first substrate 110A can be made of various other materials having different refractive indexes When the transparent organic light emitting display device 100A is a flexible transparent organic light emitting display device, the first substrate 110A may be formed of a flexible transparent insulating layer. The available flexible transparent insulating material may include polyetherimide (PEI), polyethyelene terephthalate (PET), polycarbonate (PC), polymethylmethacrylate (PMMA), polystyrene (PS), styrene acrylonitrile copolymer (SAN), silicon acryl resin, and the like in addition to polyimide (PI).

The transparent organic light emitting display device 100A may include a plurality of pixel regions. Each of the plurality of pixel regions includes a plurality of sub pixel regions including a red (R) sub pixel region, a green (G) sub pixel region, and a blue (B) sub pixel region. In some embodiments, the pixel region further includes a white (W) sub pixel region to reduce the power consumption and improve the luminance of the transparent organic light emitting display device. Herein, the pixel region may be referred to as a pixel, and a sub pixel region may be referred to as a sub pixel.

The first substrate 110A may include a pixel region including an R sub pixel region, a G sub pixel region, and a B sub pixel region, and may further include a W sub pixel region. The first substrate 110A may include a plurality of pixel region. When the first substrate 110A includes the plurality of pixel regions, the first substrate 110A may include a plurality of R sub pixel regions, a plurality of G sub pixel regions, and a plurality of B sub pixel regions, and may further include a plurality of W sub pixel regions. When the first substrate 110A includes the plurality of pixel regions, the plurality of pixel regions may be arranged in a matrix form. For convenience of description, FIG. 1A illustrates one sub pixel region, and the illustrated one sub pixel region may be one of the R sub pixel region, the G sub pixel region, the B sub pixel region, and the W sub pixel regions.

The one sub pixel region of the transparent organic light emitting display device 100A includes an emissive area EA and a transmissive area TA. The emissive area EA may be defined as a region in which light is emitted to so that lights from the plurality of emissive areas collectively form an image content. The transmissive area TA is an area where the external light can pass through. Because the external light can pass through the transmissive area TA, objects behind the display through the transmissive area TA. Accordingly, a viewer can simultaneously see the image content displayed by the transparent organic light emitting display device 100A and the background through the transmissive area TA. An area ratio between the emissive area EA and the transmissive area TA in the sub pixel region may vary depending on the image visibility and transparency of the transparent organic light emitting display device.

As shown in FIG. 1A, a thin film transistor (TFT) is formed on the first substrate 110A within the emissive area EA. The TFT includes an active layer 121A, a gate electrode 122A, a source electrode 123A, and a drain electrode 124A. One or more insulating layers may be formed between these electrodes such as a gate insulating layer 132A and/or an interlayer insulating layer 133A. The TFT may be formed in every pixel region and/or in every sub pixel region on the first substrate 110A so that each pixel or each sub pixel can be driven independent of the other pixels or sub pixels. The configuration of a TFT is not limited to the above-described example, and may be variously modified without departing from the spirit of the present invention.

The TFT described in the present disclosure can be operatively connected to an organic light emitting layer 144A to emit light. In a conventional organic light emitting device, a switching TFT and a driving TFT are used to control the organic light emitting layer 144A to emit light according to appropriate signals (e.g., data signal, scan signal). The switching TFT operates to transfer data signal from a data line to a gate electrode of the driving TFT when the scan signal is applied from a gate line. Upon receiving the date signal, the driving TFT operates to transfer current from a power line to an anode, thereby controlling the emission of the organic light emitting layer of the corresponding pixel or sub pixel. The transparent organic light emitting display device 100A may include additional TFTs, such as a TFT for a compensation circuit designed to prevent abnormal driving of the transparent organic light emitting display device 100A.

It should be noted that the TFT being illustrated in the drawings and described in the embodiments of the present disclosure may be a switching TFT, a driving TFT or any other TFT that may be included in a transparent organic light emitting display device 100A.

Also, the TFT may have an inverted-staggered structure or a coplanar structure. The inverted-staggered thin film transistor may be defined as a thin film transistor having a structure in which the gate electrode is positioned on one side of the active layer and the source/drain electrodes are positioned on the opposite side of the active layer, and may also be referred to as the bottom gate TFT. The coplanar TFT may be defined as a TFT having a structure in which the gate electrode and the source/drain electrodes are positioned on the same side of the active layer. The TFT shown in FIG. 1A has the coplanar structure, but it should be noted that an inverted staggered TFT may be employed. A transparent organic light emitting display device employing an inverted staggered TFT will be described in further detail below with reference to FIG. 1D.

The active layer 121A is formed on the first substrate 110A. The active layer 121A may include a channel region, in which a channel is formed, and a source region and a drain region in contact with a source electrode 123A and a drain electrode 124A. In the present disclosure, the active layer 121A is described as being formed of an oxide semiconductor. For example, the active layer 121A can include an indium oxide (InO)-based material, a tin oxide (SnO)-based material, a zinc oxide (ZnO)-based material, and the likes. The active layer 121A can be formed of a quaternary metal oxide composite material such as indium tin gallium zinc oxide (InSnGaZnO)-based material. The active layer 121A can also be formed of a ternary composite material including, but not limited to, an indium gallium zinc oxide (InGaZnO)-based material, an indium tin zinc oxide (InSnZnO)-based materials, an indium aluminum zinc oxide (InAlZnO)-based material, a tin gallium zinc oxide (SnGaZnO)-based material, an aluminum gallium zinc oxide (AlGaZnO)-based material and a tin aluminum zinc oxide (SnAlZnO)-based material. Further, the active layer 121A can also be a binary composite material including, but not limited to, an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material and an indium gallium oxide (InGaO)-based material. Composition ratios of the elements contained the oxide semiconductors can vary depending on the desired performance and reliability of the TFT 130A.

The gate insulating layer 132A is formed on the active layer 121A to insulate the active layer 121A from the gate electrode 122A. The gate insulating layer 132A may be formed of a single layer or a plurality of layers. Also, the length of the gate insulating layer 132A may vary based on the design of the TFT 130A. In FIG. 1A, the gate insulating layer 132A is illustrated as having a length that is substantially equal to the length of the gate electrode 122A. In some other embodiments, however, the gate insulating layer 132A can be formed over the entire emissive area EA of the first substrate 110A and may even extend over to the transmissive area TA of the first substrate 110A.

The materials for forming the gate insulating layer 132A as well as its stack configuration may vary depending on the size and/or the location of the gate insulating layer 132A. When the gate insulating layer 132A is formed only within the emissive area EA, the gate insulating layer 132A does not affect the transmissivity of the display device 100A transmissive area TA. Therefore, the gate insulating layer 132A can be formed of any material that is capable of electrically insulating the active layer 121A and the gate electrode 122A. When the gate insulating layer 132A extends further into the transmissive area TA of the first substrate 110A, however, the gate insulating layer 132A may affect the transmissivity of the display device 100A at the transmissive area TA depending on the composition and/or the stack formation of the gate insulating layer 132A. For instance, the difference of refractive indices between the first substrate 110A and the gate insulation layer 132A can cause total reflection at their interface, and distort the light passing through the transmissive area TA. Accordingly, it is preferred that the gate insulating layer 132A is formed of a material having the same or substantially the same refractive index as the first substrate 110A if the gate insulating layer 132A is to be extended into the transmissive area TA.

In cases where the gate insulating layer 132A is formed of multiple layers of different refractive indices. The layer with substantially the same refractive index as the first substrate 110A may be extended further into the transmissive area TA while the insulation layer with a refractive index that differs from the first substrate 110A is contained within the emissive area EA.

In the present disclosure, two layers or materials are said to have substantially the same refractive indices when the difference of their refractive indices is equal to or less than 0.1. Accordingly, the gate insulating layer 132A that extends into the transmissive area TA may be formed of, for example, a silicon oxide film having a refractive index of 1.45, assuming the first substrate 110A is a glass substrate having a refractive index of 1.5. In the example of multi-layered gate insulating layer 132A, the layer(s) that extends into the transmissive area TA can be formed of, for example, a silicon oxide film. The layer(s) that is limited within the emissive area EA can be formed of, for example, a silicon nitride film having a refractive index of 1.88. It should be understood that the materials for forming the gate insulating layer 132A and the first substrate 110A described above are only exemplary. The first substrate 110A can be formed of various other materials with a variety of different refractive indices, and thus the gate insulating layer 132A can also be formed with various other materials by considering the difference of the refractive indices between the materials of the gate insulating layer 132A and the materials of the first substrate 110A.

The gate electrode 122A is formed on the gate insulating layer 132A. The gate electrode 122A at least partially overlaps the active layer 121A, and specifically overlaps the channel region of the active layer 121A. Exemplary materials for forming the gate electrode 122A includes, but are not limited to, molybdenum (Mo), aluminum (Al), chromium (Cr), gold (Au), titanium (Ti), nickel (Ni), neodymium (Nd), copper (Cu), and an alloy thereof. Multi-layered stacks of these materials can also be employed as the gate electrode 122A. The interlayer insulating layer 133A is formed on the first substrate 110A to electrically insulate the gate electrode 122A from the source electrode 123A and the drain electrode 124A. Contact holes extending from the active layer 121A to the source electrode 123A and to the drain electrode 124A are formed through the interlayer insulating layer 133A so that the source electrode 123A and the drain electrode 124A contact the respective ends of the active layer 121A. The interlayer insulating layer 133A may be formed of the same material as the gate insulating layer 132A. For example, the material for forming the interlayer insulating layer 133A may include, but are not limited to, a silicon oxide, a silicon nitride or a combination thereof. Also, multi-layered stacks of these materials can be employed as the interlayer insulating layer 133A. In the example illustrated in FIG. 1A, the interlayer insulating layer 133A is formed only within the emissive area EA. In other embodiments, however, the interlayer insulating layer 133A may be formed over the entire emissive area EA and transmissive area TA of the first substrate 110A.

Similar to the gate insulating layer 132A, the materials and the stack configurations of the interlayer insulating layer 133A can change according to the location in which the interlayer insulating layer 133A is formed. When the interlayer insulating layer 133A is formed only within the emissive area EA of the first substrate 110A, the materials and the stack configuration of the interlayer insulating layer 133A do not affect the external light passing through the transmissive area TA. Therefore, the interlayer insulating layer 133A may be formed of, for instance, silicon oxide or a silicon nitride, or a combination thereof. Multilayered stacks or multilayered structure of such materials can be employed as the interlayer insulating layer 133A within the emissive area EA.

When the interlayer insulating layer 133A is formed to in both the emissive area EA and the transmissive TA of the first substrate 110A, the materials and the stack configuration of the interlayer insulating layer 133A can have detrimental effect on the transmissivity of the display device 100A at the transmissive area TA. The greater the difference of refractive indices between the interlayer insulating layer 133A and the first substrate 110A, the greater the distortion of light caused by the total reflection. Therefore, when the interlayer insulating layer 133A is formed in both the emissive area EA and the transmissive area TA of the first substrate 110A, only the layer(s) formed of a material having substantially the same refractive index as the first substrate 110A extends into the transmissive area TA. The layer(s) employed within the interlayer insulating layer 133A formed of a material with a refractive index that differs over a predetermined limit (e.g., the difference of refractive indices greater than 0.1) is formed only within the emissive area EA.

For example, an interlayer insulating layer 133A having a single-layered configuration, which covers both the emissive area EA and the transmissive area TA, may be formed of a material such as a silicon oxide with a refractive index of 1.45. An interlayer insulating layer 133A having a multi-layered configuration can be formed a plurality of layers formed of silicon oxide and silicon nitride that are alternately stacked, in which only the silicon oxide layer(s) is extended into the transmissive area TA.

The source electrode 123A and the drain electrode 124A are formed on the interlayer insulating layer 133A. The source electrode 123A and the drain electrode 124A may be electrically connected to the source region and the drain region of the active layer 121A through the contact holes formed in the interlayer insulating layer 133A and/or the gate insulating layer 132A, respectively. The source electrode 123A and the drain electrode 124A may include any one among Mo, Al, Cr, Au, Ti, Ni, Nd, and Cu or an alloy thereof. However, the source electrode 123A and the drain electrode 124A are not limited thereto, and may be formed of various materials. Further, the source electrode 123A and the drain electrode 124A may include multiple layers including any one selected from the group consisting of Mo, Al, Cr, Au, Ti, Ni, Nd, and Cu or an alloy thereof.

A passivation layer may be formed over the TFT disposed in the emissive area EA. The passivation layer is a protection layer, which provides electrical stability by isolating the transistor surface from electrical and chemical conditions in the environment. The passivation layer may be formed of the same material as the interlayer insulating layer 133A and/or the gate insulating layer 132A such as a single layer of silicon oxide or silicon nitride or multiple layers thereof. However, the passivation layer is not limited thereto, and may be formed of various materials. When the passivation layer is formed in both the emissive area EA and the transmissive area TA, the passivation layer may be formed in the similar stack configuration as the gate insulating layer 132A and/or the interlayer insulating layer 133A.

As depicted in FIG. 1A, the overcoating layer 134A is formed on the first substrate 110A to provide a planar surface from the emission area EA to the transmissive area TA. In other words, the overcoating layer 134A planarizes a top of the first substrate 110A. As such, the overcoating layer 134A may be referred to as a planarization layer. In embodiments employing a passivation layer as described above, the overcoating layer 134A may be formed on the passivation layer. Further, the overcoating layer 134A may be provided with a contact hole that exposes the source electrode 123A and/or the drain electrode 124A, which may be electrically connected to other electrodes of the organic light emitting device 100A.

As illustrated in FIG. 1A, the overcoating layer 134A may compensate for the height difference between the emissive area EA and the transmissive area TA, which is caused by formation of various elements in the emissive area EA, thereby planarizing the surface over the emissive area EA and the transmissive area TA. In the exemplary embodiments shown in FIG. 1A, the overcoating layer 134A is formed on the TFT (e.g., the active layer 121A, the gate electrode 122A, the source electrode 123A, the drain electrode 124A) and other insulating layers (e.g., the gate insulating layer 132A, the interlayer insulating layer 133A, the passivation layer) disposed in the emissive area EA of the first substrate 110A, and extended further into the transmissive area TA of the first substrate 110A. Since there is no other elements formed in the transmissive area TA of the first substrate 110A, the overcoating layer 134A is disposed on the upper surface of first substrate 110A in the transmissive area TA, and fills the space caused by the missing elements (e.g., the gate insulating layer 132A, the interlayer insulating layer 133A, the TFT, etc.) in the transmissive area TA of the first substrate 110A.

The overcoating layer 134A is made of a material that has the same refractive index as that of the first substrate 110A. As described above, distortion of light such as total reflection of the light is caused in the interface between the first substrate 110A and the overcoating layer 134A if their refractive indices do not match, or otherwise differ more than the predetermined threshold value (e.g., 0.1). Therefore, in the transparent organic light emitting display device 100A of an embodiment, the refractive index of the overcoating layer 134A is the same, or substantially the same, as that of the first substrate 110A. In the present disclosure, elements or materials are described as having "substantially the same refractive index" even if their refractive indices are not exactly the same so long as the difference is small enough (e.g., equal to or less than 0.1) to minimize the total reflection of light at the interfacing surface of the elements. The material for forming the overcoating layer 134A may include, but are not limited to, polyaluminum chloride (PAC) which is a resinous material having a refractive index of 1.5 or silicon oxide ($SiO_x$). Hereinafter, for convenience of description, it is described that the overcoating layer 134A is formed of PAC.

The organic light emitting element 140A including an anode 141A, the organic light emitting layer 144A, and a cathode 145A is formed on the overcoating layer 134A. The organic light emitting element 140A is driven by the emission principle through recombination of holes provided from the anode 141A and electrons provided from the cathode 145A in the organic light emitting layer 144A to form an image.

The transparent organic light emitting display device 100A is an independent driving type display device, and is driven in sub pixel region units. Therefore, the above-described TFT and organic light emitting element 140A are disposed in each of the sub pixel regions so that the TFT disposed in each of the sub pixel region independently drives the organic light emitting element 140A.

As depicted in FIG. 1A, the anode 141 is formed on the overcoating layer 134A. The anode 141A may be referred to a positive electrode, a pixel electrode, or a first electrode. The anode 141 may be connected to the source electrode 123A of the TFT through the contact hole formed in the overcoating layer 134A. However, the connection of the anode is not limited thereto, and the anode may be connected to the drain electrode 124A according to a type of the thin film transistor.

The anode 141A may be formed of a conductive material having a high work function to provide holes. The transparent conductive layer 143A may be formed of a material having a high work function, for example, a transparent conductive oxide (TCO). Materials for forming the transparent conductive layer 143A may include, but are not limited to, indium tin oxide (ITO), indium zinc oxide (IZO), Indium tin zinc oxide (ITZo), zinc oxide (ZO), tin oxide (TO), or a combination thereof.

In FIG. 1A, the transparent organic light emitting display device 100A is a top-emission type organic light emitting display device. Generally, the organic light emitting layer 144A emits light in all directions. Although the emitted light may be reflected off by some of the elements disposed under the transparent conductive layer 143A and exit towards the top of the organic light emitting element 140A, a significant portion of the light may still exits through the first substrate 110A, leading to poor luminance efficiency. As such, when the organic light emitting display device is configured as a top-emission type, the anode 141A can be formed of stacked layers of a reflection layer 142A and a transparent conductive layer 143A, in which the reflection layer 142A is formed below the transparent conductive layer 143A.

The reflection layer 142A may be formed of a material having low electrical resistance property and good light reflectivity, for example, silver (Ag), Ni, Au, platinum (Pt), Al, Cu, molybdenum/aluminum neodymium (Mo/AlNd), or a combination thereof. Herein, the anode 141A is defined to include the transparent conductive layer 143A and the reflection layer 142A, but the anode 141A may be defined to include only transparent conductive layer 143A, and the reflection layer 142A may be defined as a separation configuration. Further, herein, it has been described that the anode includes a transparent conductive material having high work function and a reflection metal layer, however, the anode 141A in itself may be formed of a conductive material having high work function and good reflectance.

Since the anode 141A primarily serves to provide holes to the organic light emitting layer 144A, the anode 141A only needs to be formed in the emissive area EA. Accordingly, the anode 141A is formed in the emissive area (EA) in each of the pixel/sub pixel regions of the first substrate 110A so that each of the pixel/sub pixel regions can be driven individually. As for the transparent conductive layer 143A, external light can still pass through the transmissive area TA even if the transparent conductive layer 143A is extended further into the transmissive area TA, albeit at decreased clarity. The reflection layer 142A, however, may significantly or wholly block the external light if it is extended into the transmissive area TA. Therefore, the reflection layer 142A should not be extended into the transmissive area TA.

Any one or both of the transparent conductive layer 143A and the reflection layer 142A that constitute the anode 141A may be electrically connected to the source electrode 123A. In FIG. 1A, the electrical connection between the source electrode 123A and the anode 141A is made by connecting the transparent conductive layer 143A to the source electrode 123A via a contact hole formed through the overcoating layer 134A and the reflection layer 142A. In some other embodiments, however, such electrical connection between the source electrode 123A (or the drain electrode 124A) and the anode 141A can be made by connecting the reflection layer 142A to the source electrode 123A via a contact hole through the overcoating layer 134A.

The bank layer 135A is formed on the overcoating layer 134A. The bank layer 135A serves to divide adjacent sub pixel regions, and additionally serves to divide the emissive area EA and the transmissive area TA in one sub pixel region. The bank layer 135A may be formed to open a portion of the anode 141A. The bank layer 135A can be formed of an organic insulating material, for example, any one of polyimide, photoacryl, and benzocyclobutene (BCB). The bank layer 135A may be formed in a tapered shape. When the bank layer 135A is formed in a tapered shape, the bank layer 135A may be formed using a positive photoresist.

In some embodiments, the transparent organic light emitting display device 100A may employ direct emission organic light emitting elements (referred hereinafter as "RGB type"). The RGB type organic light emitting element generally uses three sub pixels that each emits a designated color (red, green or blue) to create a full-color pixel without filtering the light from the sub pixels. In some other embodiments, the transparent organic light emitting display device 100A may employ white organic light emitting elements in conjunction with color filters (referred hereinafter as "RGBW type"). The white organic light emitting element is configured to emit white light, and the white light is passed through a color filter to form a specific color (red, green, blue) at each of the sub pixels. The white organic light emitting element may have additional sub pixel, which emits white light without being filtered to increase the overall luminance of each pixel of the display device 100A.

As described above, each sub pixel region has an emissive area EA and a transmissive area TA, and the anode 141A is formed in the emissive area EA in each of the sub pixel regions. The red sub pixel region, the green sub pixel region and the blue sub pixel region can be defined by openings in the bank layer 135A. When the transparent organic light emitting display device 100A employs the RGB type organic light emitting elements 140A, the organic light emitting layer 144A that emits one of red, green or blue light is formed on the anode 141A so that each sub pixel directly emits a corresponding colored light without a color filter. When the transparent organic light emitting display device 100A employs the RGBW type organic light emitting elements 140A, a white organic light emitting layer 144A may be formed over the substantially the entirety of the first substrate 110A. Alternatively, the white organic light emitting layer 144A may be discretely formed in the emissive area of the red, green and blue sub pixel regions to be separated from each other.

In FIG. 1A, for convenience of description, the organic light emitting element 140A is illustrated as the RGBW type and that the organic light emitting layer 144A formed in the emissive area EA is a white organic light emitting layer. The arrangement of the color filters will be described in further detail below with reference to FIG. 1C.

The cathode 145A is formed on the organic light emitting layer 144A. The cathode 145A may be referred to as a negative electrode, a common electrode, or a second electrode. The cathode 145A is connected to a separate voltage line, and may apply the same voltage to all the sub pixel regions.

The cathode 145 is formed of a material having high electrical conductivity and a low work function, that is, a cathode material to provide electrodes. The specific material constituting the cathode 145A may be different according to an emission type of the flexible organic light emitting display device. In a top-emission type organic light emitting display device as shown in FIG. 1A, the cathode 145A may be formed of a very thin layer of a metal material having a low work function. Materials for forming the cathode 145A may include, but are not limited to, Ag, Ti, Al, Mo, or an alloy of Ag and Mg. In the top-emission type, the cathode 145A should have a thickness of several hundreds of Å or less, for example, 200 Å or less. At this range, the cathode 145A is substantially a transparent. Even if metal layer having high light reflectivity is used, sufficient transparency can be obtained if the cathode 145A is formed in a thickness equal to or less than a predetermined thickness (for example, 200 Å). As such, the cathode 145A may be substantially referred to as a transparent cathode. The cathode 145A can also be formed with a material including carbon nano tube and/or graphene, which is known to be highly conductive and transparent.

The cathode 145A is formed in the emissive area EA of each of the sub pixel regions of the first substrate 110A. As described above, the emissive area EA is a region that emits light to collectively display the actual image and the transmissive area TA is a region in which external light is passed through, and thus the cathode 145A needs to be formed in the emissive area EA. In FIG. 1A, the cathode 145A is illustrated as being formed only on the emissive area EA. However, the cathode 145A can be substantially transparent when its thickness is sufficiently thin, or otherwise has a thickness below a predetermined threshold value (e.g., 200 Å or less). As such, in some embodiments, the cathode 145A may be formed in the emissive area EA and the transmissive area TA.

To improve transmittance and minimize degradation in luminance, it is important to improve the transmittance of the external light through the transparent organic light emitting display device 100A, especially the light entering from the first substrate 110A and exiting to the top of the device 100A. Referring to FIG. 1A, in the transparent organic light emitting display device 100A according to an embodiment, the organic light emitting element 140A is not formed on the overcoating layer 134A formed in the transmissive area TA of the first substrate 110A. Instead, only the first substrate 110A and the overcoating layer 134A are formed in the transmissive area TA of the first substrate 110A, in which the first substrate 110A and the overcoating layer 134A have substantially the same the refractive index. Therefore, distortion such as total reflection of light in the interface between the first substrate 110A and the overcoating layer 134A is minimized, or eliminated, to improve the transmittance at the transmission area(s) TAs of the transparent organic light emitting display device 100A.

Figure 1B:
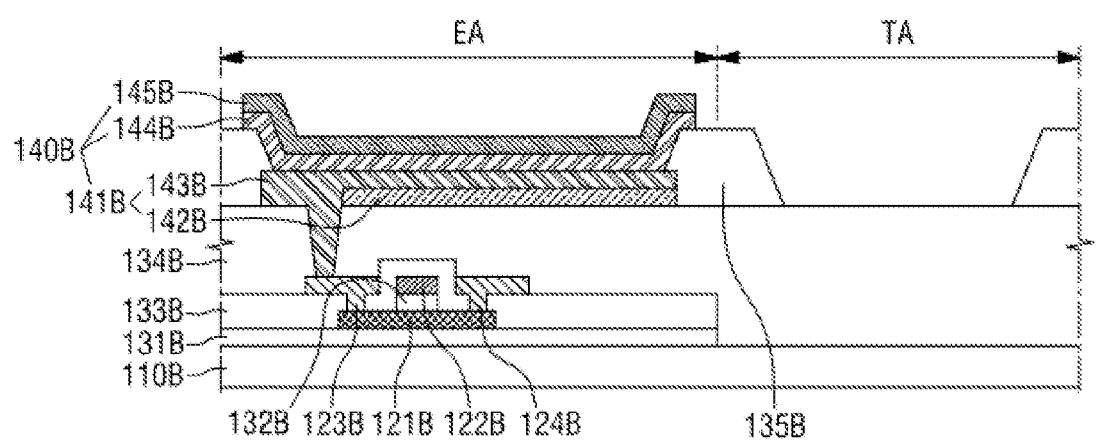

FIG. 1B is a cross-sectional view illustrating an exemplary transparent organic light emitting display device 100B according to an embodiment of the present invention. In should be noted that the same elements are denoted with the same numerals in the drawings of the present disclosure. As such, the element illustrated in FIG. 1A and FIG. 1B that are denoted with the same numeral should be understood as the same element, and thus repeated description thereof will be omitted.

As shown in FIG. 1B, a buffer layer 131B is formed on a first substrate 110B to reduce permeation of moisture or other impurities through the first substrate 110B, and to planarize the surface of the first substrate 110B. The inclusion of the buffer layer 131B in the organic light emitting display device is optional, and may or may not be employed in the organic light emitting display device based on the materials of the first substrate 110B and/or the TFT.

The buffer layer 131B can be formed of a single layer or multiple layers. When the buffer layer 131B is formed of multiple layers, a layer of silicon oxide and a layer of silicon nitride may be alternately stacked. Specific order of the layers within the buffer layer 131B can be configured by considering the interface characteristic between the buffer layer 131B and the TFT. More specifically, the material for forming the buffer layer 131B may be selected according to the interface characteristic with the active layer 121B depending on the structure of the thin film transistor. For example, the buffer layer and the semiconductor layer may be in direct contact in a coplanar TFT. In this case, a layer containing hydrogen atoms may react with the oxide semiconductor and form moisture within the TFT, thereby negatively affecting the performance of the TFT. For this reason, in a coplanar TFT using an oxide semiconductor, the layer of the buffer layer 131B contacting the oxide semiconductor should not contain hydrogen. For example, the buffer layer 131B may be formed of a stack of silicon oxide layer and a silicon nitride layer, and the layer contacting the oxide semiconductor can be a silicon oxide layer rather than the silicon nitride layer.

When the buffer layer 131B is formed in a multi-layered stack of a silicon oxide layer and a silicon nitride layer, the refractive index of the silicon oxide (1.45) is substantially the same as the refractive indexes of the first substrate 110B (assuming the first substrate 110B is made of glass: refractive index of 1.5) and the overcoating layer 134B. However, the refractive index of the silicon nitride layer (i.e., 1.88) is greater than the refractive indices of the first substrate 110B and the overcoating layer 134B by more than the threshold value (e.g., 0.1). Such difference in the refractive indices causes distortion of light such as total reflection of light at their interface. Therefore, as illustrated in FIG. 1B, only the layer(s) among the multi-layered buffer layer 131B that has the same or substantially the same refractive index as the first substrate 110B and the overcoating layer 134B (e.g., silicon oxide layer) may be extended out to the transmissive area TA while other layer(s) (e.g., silicon nitride layer) are contained within the emissive area EA.

Figure 1C:
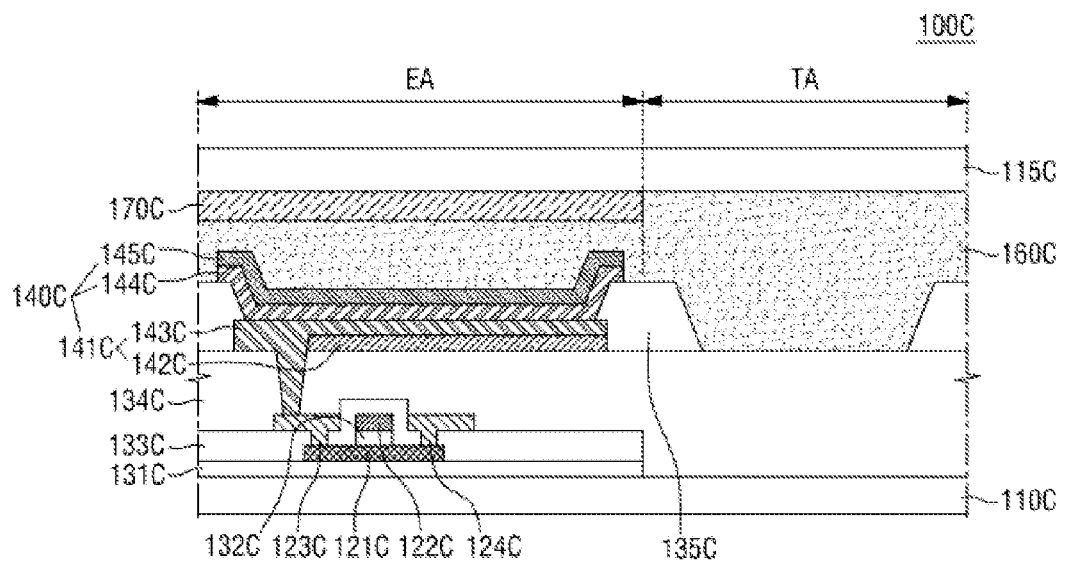

FIG. 1C is a cross-sectional view illustrating an exemplary transparent organic light emitting display device 100C according to an embodiment of the present invention. In should be noted that the same elements are denoted with the same numerals in the drawings of the present disclosure. As such, the element illustrated in FIG. 1A and FIG. 1C that are denoted with the same numeral should be understood as the same element, and thus repeated description thereof will be omitted.

The second substrate 115C is a substrate configured to support and protect various elements of a transparent organic light emitting display device 100C, and disposed to face the first substrate 110C. The second substrate 115C is a supporting plate located in a top of the transparent organic light emitting display device 100C, and may be referred to as an upper substrate, a protection substrate, a color filter substrate, a cover, a cover substrate, and an upper supporting member, or the like. The second substrate 115C may include a transparent insulating material, and the second substrate 115C may be formed of substantially the same material as the first substrate 110C. Therefore, the second substrate 115C may have substantially the same refractive index as the first substrate 110C.

A black matrix may be formed on the second substrate 115C. The black matrix may be formed in a boundary between the sub pixel regions. The black matrix may be formed of chromium (Cr) or another opaque metal, or formed of a resin. The black matrix may separate sub pixel regions and color filters 170C formed in the sub pixel regions.

When the transparent organic light emitting display device 100C employs RGBW type organic light emitting element, a color filter 170C is formed on the second substrate 115C. The color filter 170C may be formed in each of the sub pixel regions on the second substrate 115C. When the color filter 170C is formed in the red sub pixel region, the color filter 170C may be a red color filter. When the color filter 170C is formed in the green sub pixel region, the color filter 170C may be a green color filter. When the color filter 170C is formed in the blue sub pixel region, the color filter 170C may be a blue color filter. As described above, the organic light emitting layer 144C is configured to emit white light, and filtered by the color filter 170C. For example, the white light emitted by the organic light emitting layer 144C is filtered by the red color filter to be transformed into red light, filtered by the green color filter to be transformed into green light, and filtered by the blue color filter to be transformed into blue light. As illustrated in FIG. 1C, when the transparent organic light emitting display device 100C is a top-emission type organic light emitting display device, the color filter 170C is disposed at the upper side the organic light emitting layer 144C.

The color filter 170C is formed in a region corresponding to an emissive area EA of the second substrate 115C. As illustrated in FIG. 1C, when the transparent organic light emitting display device 100C is a top-emission type organic light emitting display device, and the organic light emitting layer 144C emits white light, the white light emitted by the organic light emitting layer 144C is passed through the color filter 170C to be transformed into light of a specific color. However, since a transmissive area TA is not a region emitting light of a specific color but a region transmitting external light of the transparent organic light emitting display device 100C, when the color filter 170C is disposed in the transmissive area TA, a color of the external light is color-shifted to the color represented by the color filter 170C. Therefore, the color filter 170C is not formed in the transmissive area TA, but formed only in the emissive area EA.

Although now shown in FIG. 1C, in some embodiments, a polarizing film may be disposed on the second substrate 115C. Specifically, the polarizing film may be disposed on a surface of the second substrate 115C opposite to the surface on which the color filter 170C is formed. The polarizing film may improve linearity of the light emitted from the organic light emitting layer 144C to prevent scattering or interference and improve color sense. Further, the polarizing film may selectively transmit the external light, and reduce the reflection of external light to improve visibility of the organic light emitting display device.

In the exemplary embodiment shown in FIG. 1C, an encapsulating layer 160C is formed between the first substrate 110C and the second substrate 115C. More specifically, the encapsulating layer 160C is formed between the organic light emitting element 140C and the color filter 170C within the emissive area EA. Also, in the transmissive area TA, the encapsulating layer 160C is formed between the overcoating layer 134C and the second substrate 115C. The encapsulating layer 160C may protect internal elements of the transparent organic light emitting display device 100C such as the TFT and the organic light emitting element 140C from moisture, air, and shock from the external environment. The encapsulating layer 160C may be referred to as an encapsulating layer, an encapsulating member, a sealing layer, or a sealing member. For example, as the encapsulating layer 160C, a face seal may be used.

A refractive index of the encapsulating layer 160C is substantially the same as that of the overcoating layer 134C. Therefore, the refractive indices of the first substrate 110C, the overcoating layer 134C, the encapsulating layer 160C, and the second substrate 115C may substantially the same in the region corresponding to the transmissive region TA. A material of the encapsulating layer 160C for matching of a refractive index may include, but are not limited to, glycerol, 1,2-propanediol, glycerin, trimethylopropane, triethanolamine, ethylene glycol, 1,3-propanediol, 1,4-butanediol, 1,8-octanediol, 1,2-butanediol, 2,3-butanediol, 1,2-pentanediol, etohexadiol, p-Methane-3,8-diol, and 1-Methyl-2,4-pentanediol. The material of the encapsulating layer is not limited thereto, and another adhesive material substantially having the same refractive index as that of the first substrate 110C may be used.

In the transparent organic light emitting display device 100C, refractive indices of insulating materials constituting the overcoating layer 134C and the encapsulating layer 160C disposed in the transmissive area TA of the first substrate 110C and the second substrate 115C are substantially the same as those of the first substrate 110C and the second substrate 115C. Therefore, distortion such as total reflection of the light in the region corresponding to the transmissive area TA of the transparent organic light emitting display device 100C may be minimized.

In some embodiments, a transparent resin layer may be formed in a region of the second substrate 115C in which the color filter 170C is not formed, that is, in a region of the second substrate 115C corresponding to the transmissive area TA of the first substrate 110C. As described above, it is preferable that the external light passes through the transmissive area TA of the transparent organic light emitting display device 100C with minimum distortion. Therefore, the transparent resin layer may be formed in the second substrate 115C corresponding to the transmissive region TA, and the transparent resin layer may be formed to the same thickness as that of the color filter 170C. The transparent resin layer may be formed of a material having substantially the same refractive index as those of the second substrate 115C and the encapsulating layer 160C.

Figure 1D:
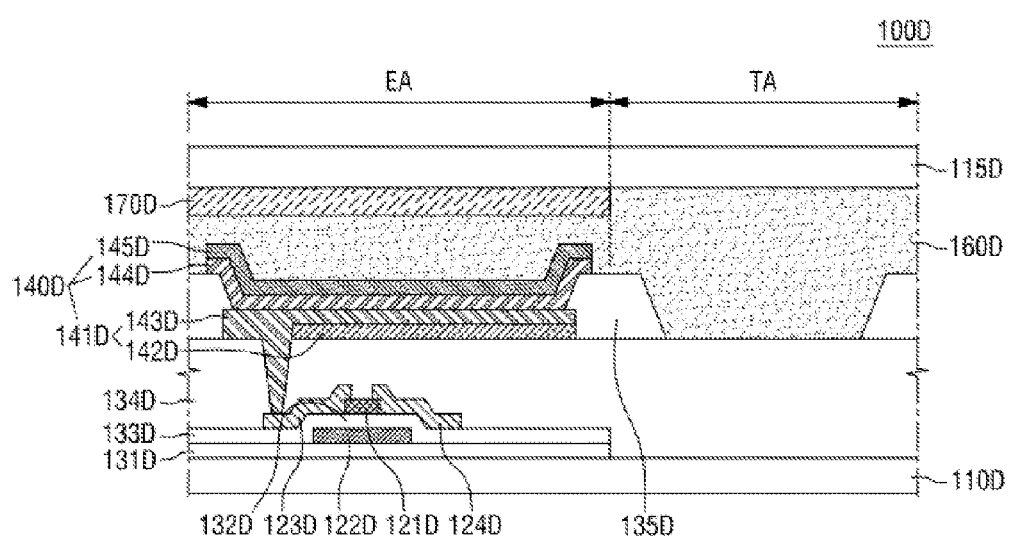

FIG. 1D is a cross-sectional view illustrating a transparent organic light emitting display device according to an embodiment of the present invention. Referring to FIG. 1D, the first substrate 110D, the overcoating layer 134D, the organic light emitting element 140D, the bank layer 135D, the encapsulating layer 160D, the color filter 170D, and the second substrate 115D are substantially the same as the respective elements depicted in FIG. 1C, and thus repeated description will be omitted.

In the embodiment shown in FIG. 1D, an inverted-staggered TFT is used as opposed to the coplanar TFT used in the embodiment shown in FIG. 1C. A buffer layer 131D is formed on the first substrate 110D. As described above, the buffer layer 131D is an optional element, and its inclusion in the display device may depends on the type of the first substrate 110D and/or the type of TFT used in display device 100D.

When an inverted-staggered TFT is employed in the display device, a silicon nitride based buffer layer is more advantageous than the silicon oxide based buffer layer for the transistor efficiency due to the interface characteristic with the active layer 121D. The buffer layer 131D formed of silicon nitride, however, may distort the external light passing through the display device 100D due to the relatively large refractive index difference with respect to the other elements (e.g., first and second—assuming glass—substrates, overcoating layer, interlayer insulating layer, encapsulating layer). Accordingly, the buffer layer 131D is formed only within the emissive area EA to improve transmittance in the transmission area TA and minimize degradation in luminance of the display device 100D.

As previously described, the buffer layer 131D may be formed with multiple layers, which may include one or more layers of silicon oxide and one or more layers of silicon nitride. Since the silicon nitride based buffer layer is likely to improve the TFT efficiency (inverted-staggered TFT), the upper most layer of the multi-layered buffer layer may be formed of silicon nitride. The location for disposing the multi-layered buffer layer in the display device, however, remains the same as the embodiments employing the coplanar TFT. That is, since the refractive index of the silicon oxide film is 1.45 and the refractive index of the silicon nitride film is 1.88, the distortion of light such as total reflection of light is caused when both the silicon oxide film and the silicon nitride film of the buffer layer 131D are formed in the transmissive area TA. Therefore, as illustrated in FIG. 1D, the buffer layer 131D may be formed only in the emissive area EA, or alternatively, only the layer(s) of the multi-layered buffer layer that has the same refractive index as the other elements disposed in the transmissive area TA extends further into the transmissive area TA.

The gate electrode 122D may be formed on the first substrate 110D or on the buffer layer 131D as depicted in FIG. 1D. Other than a formation location of the gate electrode 122D formed on the first substrate 110D according to the structure of the thin film transistor, that is, the inverted-staggered thin film transistor, the gate electrode 122D is substantially the same as that of FIG. 1A, and thus repeated description will be omitted.

The gate insulating layer 132D is formed on the gate electrode 122D. The gate insulating layer 132D insulates the active layer 121D from the gate electrode 122D. Other than being formed on the gate electrode 122D and below the active layer 121D, other aspects of the gate insulating layer 132D is substantially the same as that of FIG. 1A.

The active layer 121D is formed on the gate insulating layer 132D. The active layer 121D may be formed on the gate electrode 122D and the gate insulating layer 132D to be in contact with a partial region of the gate electrode 122D. Other than being formed on the gate insulating layer 132D, other aspects of the active layer 121D is substantially the same as that of FIG. 1A.

The source electrode 123D and the drain electrode 124D are formed on the gate insulating layer 132D. The source electrode 123D is formed to be in contact with a partial region of the gate insulating layer 132D and a partial region of the active layer 121D formed on the gate insulating layer 132D. The drain electrode 124D is formed to be in contact with the other partial region of the gate insulating layer 132D and the other partial region of the active layer 121D formed on the gate insulating layer 132D. Other than the formation location of the source electrode 123D and the drain electrode 124D, other aspects of the source electrode 123D and the drain electrode 124D are substantially the same as those of FIG. 1A. Although not shown in FIG. 1D, a separate resistance reduction member may be disposed between the active layer 121D and the source electrode 123D and between the active layer 121D and the drain electrode 124D to reduce the contact resistance between the active layer 121D and the source electrode 123D and between the active layer 121D and the drain electrode 124D.

Figure 2A:
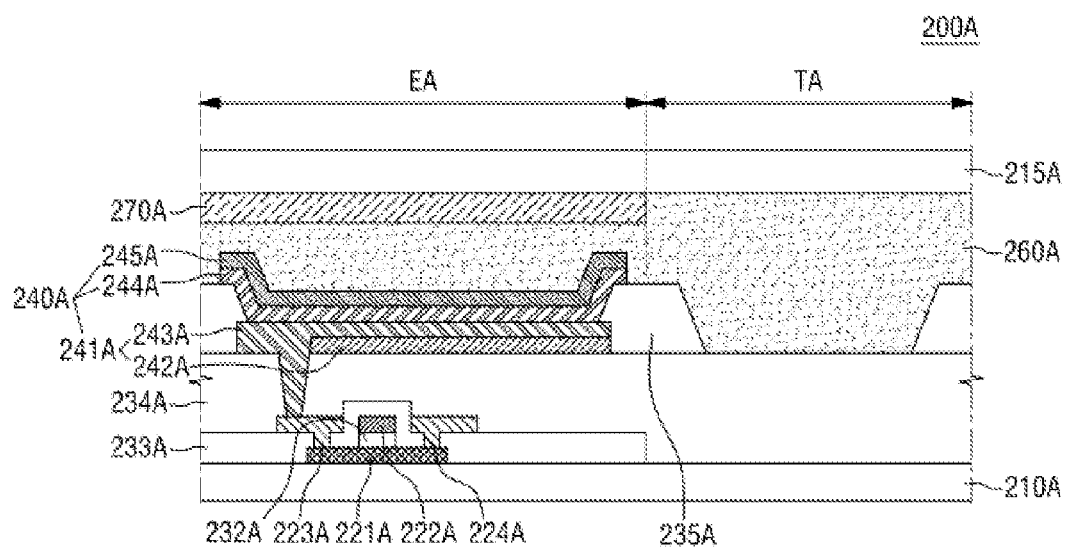
FIG. 2A is a cross-sectional view illustrating a transparent organic light emitting display device in accordance with another embodiment of the inventive concept.

FIG. 2A is a cross-sectional view illustrating a transparent organic light emitting display device according to an embodiment of the present invention. Referring to FIG. 2A, a transparent organic light emitting display device 200A includes a first substrate 210A, a thin film transistor, a gate insulating layer 232A, an interlayer insulating layer 233A, an overcoating layer 234A, an organic light emitting element 240A, and a bank layer 235A. The first substrate 210A, the thin film transistor, the gate insulating layer 232A, the interlayer insulating layer 233A, an overcoating layer 234A, the organic light emitting element 240A, and the bank layer 235D are substantially the same as those of FIG. 1C, and thus repeated description will be omitted.

The transparent organic light emitting display device 200A includes a first insulating layer and a second insulating layer formed between the first substrate 210A and the second substrate 215A. Among the first and second insulating layers, the insulating layers having substantially the same refractive index as the first substrate 210A are disposed in both the emissive area EA and the transmissive area TA, while the insulating layers having refractive index that differs from the refractive index of the first substrate 210A by more than certain value are disposed only within the emissive area EA. For convenience of description, the first insulating layer refers to the insulating layer with a refractive index that differs from the refractive index of the first substrate 210A by more than certain value. Also, the second insulating layer refers to the insulating layer having the same or substantially the same refractive index as the first substrate 210A. More detailed description for the first insulating layer and second insulating layer will be made with reference to FIG. 2B.

Figure 2B:
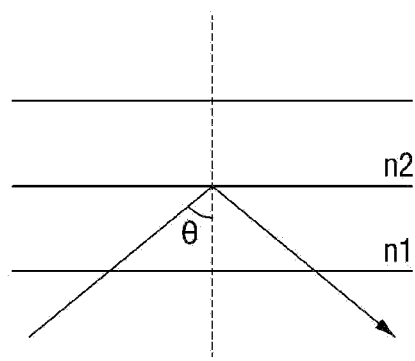
FIG. 2B is a conceptual diagram illustrating a transparent organic light emitting display device in accordance with another embodiment of the inventive concept.
Figure 2B:
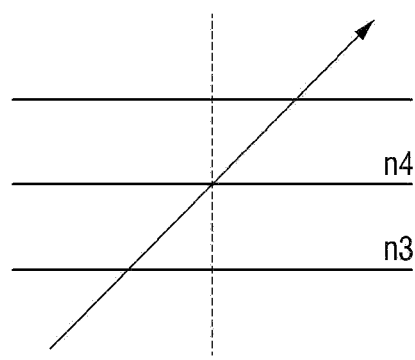

Reference is now made to FIG. 2B, which is a pictorial representation of how light propagates through multiple optical mediums. FIG. 2B(a) illustrates refraction of light when the light travels through a medium having a refractive index $n_1$ to a medium having a refractive index $n_2$, in which the refractive index $n_1$ is larger than the refractive index $n_2$. FIG. 2B(b) illustrates refraction of light when the light travels through a medium having a refractive index $n_3$ to a medium having a refractive index $n_4$, in which the refractive index $n_3$ substantially the same as the refractive index $n_4$. In FIGS. 2B(a) and 2B(b), it is assumed that an incident angle ($\theta$) of incident light is larger than the critical angle.

Referring to FIG. 2B(a), when the light travels from a medium having a high refractive index to a medium having low refractive index, the light projected an incident angle greater than the critical angle reflected off at the interface between the two medium. Therefore, when the light travels from the medium having the refractive index $n_1$ to the medium having the refractive index $n_2$, the light does not pass through the boundary between the medium having the refractive index $n_1$ and the medium having the refractive index $n_2$, and is totally-reflected back toward the medium having the refractive index $n_1$. For example, the medium having the refractive index $n_1$ may be the buffer layer including a silicon nitride film, and the interlayer insulating layer, and the likes, and the medium having the refractive index $n_2$ may be the buffer layer including a silicon oxide film, the interlayer insulating layer, the first substrate, the overcoating layer, and the encapsulating layer.

However, as illustrated in FIG. 2B(b), when light travels to the media having the refractive index, which substantially the same, the light is not reflected, and crosses the interface between the two mediums, then eventually passes through them. For example, the media having refractive indexes $n_3$ and $n_4$ may be the buffer layer including a silicon oxide film, the first substrate, the overcoating layer, and the encapsulating layer. Therefore, it is preferred to match the refractive indices of the medium disposed along the path of the light to minimize such total reflection.

Referring back to FIG. 2A, the second insulating layer may be the overcoating layer 234A substantially having the same refractive index as that of the first substrate 210A and formed in the transmissive area TA. The first insulating layer may be the gate insulating layer 232A or the interlayer insulating layer 233A having a refractive index which is not substantially the same as the first substrate 210A being formed only in the emissive area EA. Accordingly, in the transparent organic light emitting display device 200A, all of the insulating layers, which are formed to be extended from the emissive area EA to the transmissive area TA, are formed with a material having the same or at least substantially the same refractive index as the first substrate 210A. In this way, the light transmittance at the transmissive area TA and the luminance of the display device 200A can be improved.

Figure 2C:
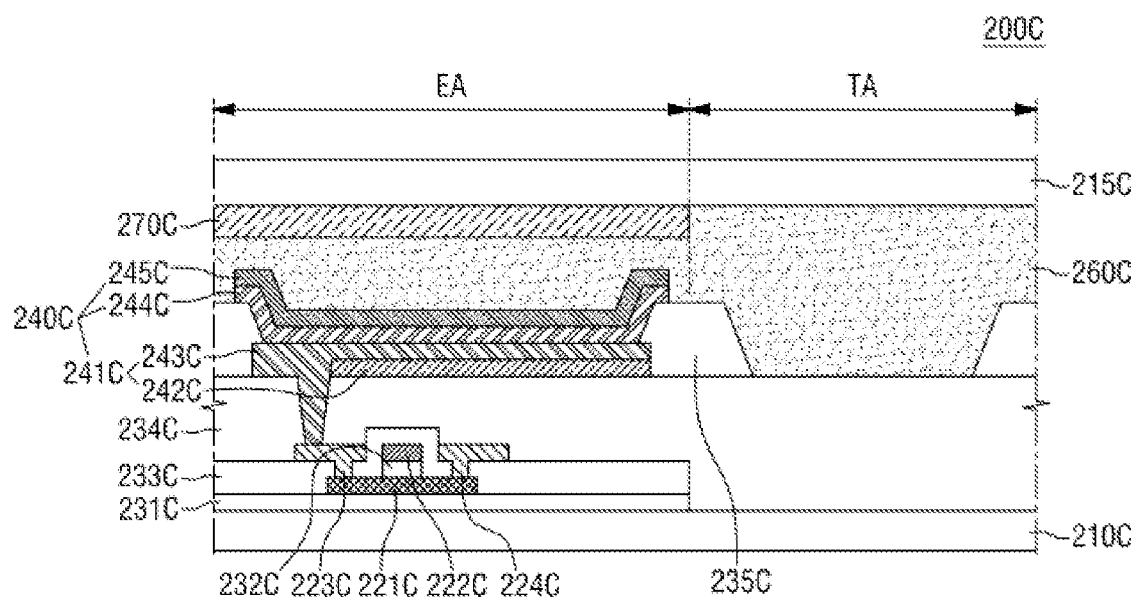
FIGS. 2C to 2F are cross-sectional views illustrating transparent organic light emitting display devices in accordance with various embodiments of the inventive concept.
Figure 2D:
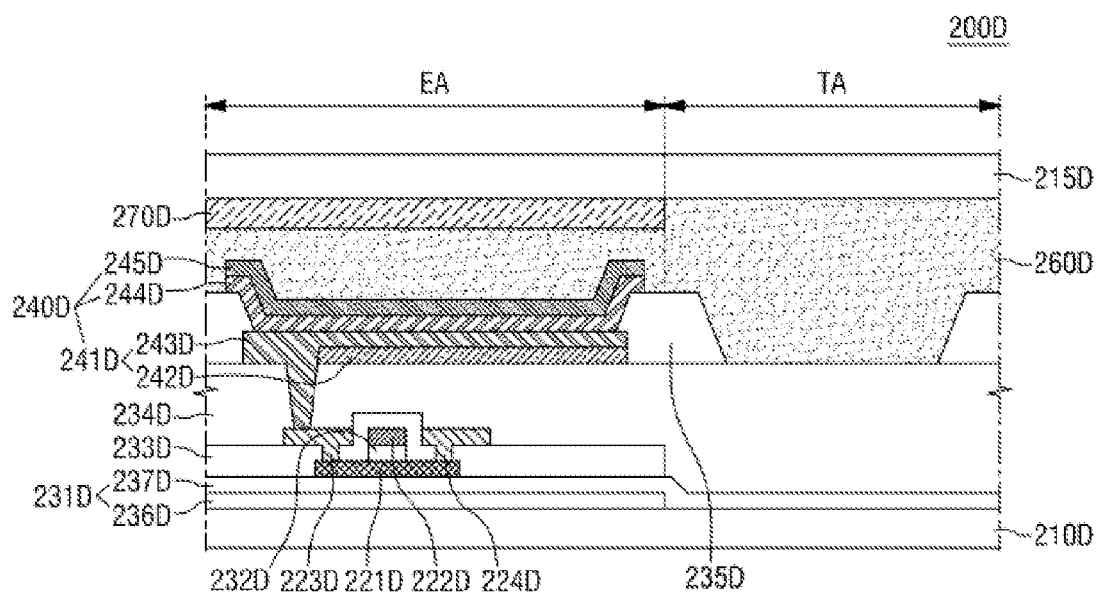
Figure 2E:
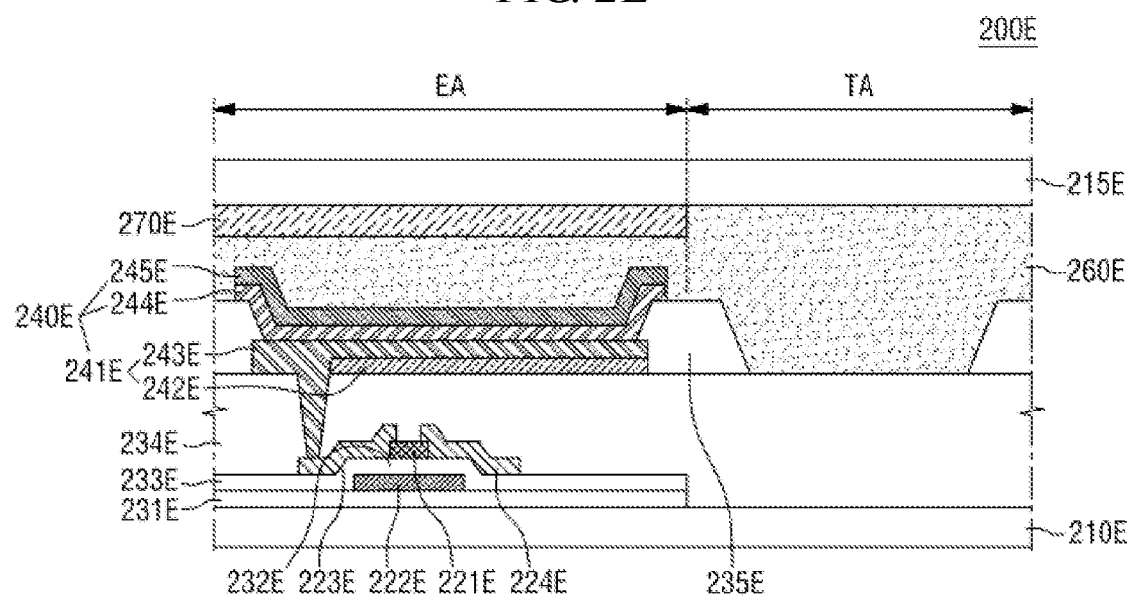

FIGS. 2C and 2E are cross-sectional views, each illustrating a transparent organic light emitting display device according to an embodiment of the present invention. A buffer layer (231C, 231E) formed on the first substrate (210C, 210E) for reducing permeation of moisture or other impurities through the first substrate (210C, 210E). The buffer layer (231C, 231E) may be formed of materials selected based on the type of the TFT employed in the display device, particularly based on the interface characteristic of the active layer (221C, 221E). For a coplanar TFT as shown in FIG. 2C, which has its active layer 221C in contact with the buffer layer 231C, the buffer layer formed of a silicon oxide film provides better transistor efficiency due to the interface characteristic with the active layer 221C. On the other hand, for an inverted-staggered TFT as shown in FIG. 2E, the buffer layer 232E formed of a silicon nitride film provides better transistor efficiency due to the interface characteristic with the active layer 221E.

Assuming the first substrate is formed of glass, the buffer layer 231C formed of the silicon oxide film is considered to have substantially the same refractive index of the first substrate 210C. (e.g., 1.5 and 1.45) Further, the buffer layer 231C has substantially the same refractive index as the overcoating layer 234C that has the same or substantially the same refractive index as the first substrate 210C. Since the refractive index of these layers substantially match with respect to each other, total reflection of the light at the interface of these layers can be minimized. While the buffer layer 231C can be formed only in the emissive area EA as illustrated in FIG. 2C, the buffer layer 231C formed in the emissive area EA may be extended further to the transmissive area TA for various reasons, such as for improved durability, prevention of moisture/impurity prevention as well as ease of fabrication.

Referring to FIG. 2D, the buffer layer 231E can be formed in stacks of layers (e.g., first buffer layer 236D and second buffer layer 237D). Each layer may be formed of one or more of different materials. For instance, the first buffer layer 236D can be formed of silicon nitride and the second buffer layer 237D can be formed of silicon oxide. The order of layers being stacked in forming the buffer layer 231D can still be based on the type of the TFT employed in the display device 200D. Since a layer formed of Silicon oxide is more advantageous for coplanar TFT in terms of transistor efficiency; the second buffer layer 237D formed of silicon oxide is used as the upper most layer of the buffer layer 231E. In contrast, since a layer formed of silicon nitride is more advantageous for inverted-staggered TFT, a layer formed of silicon nitride should be the layer of the buffer layer being in contact with the active layer of the TFT.

It should be reminded that refractive index of Silicon nitride layer (i.e., 1.88) is much higher than the silicon oxide layer. Therefore, the layer formed of silicon nitride and the layer formed of silicon oxide should not be formed in the transmissive area TA of the display device. For instance, any layers including silicon nitride should not be extended further into the transmissive area TA if the first substrate is formed of glass (or other material having refractive index that differs by more than 0.1).

Figure 2F:
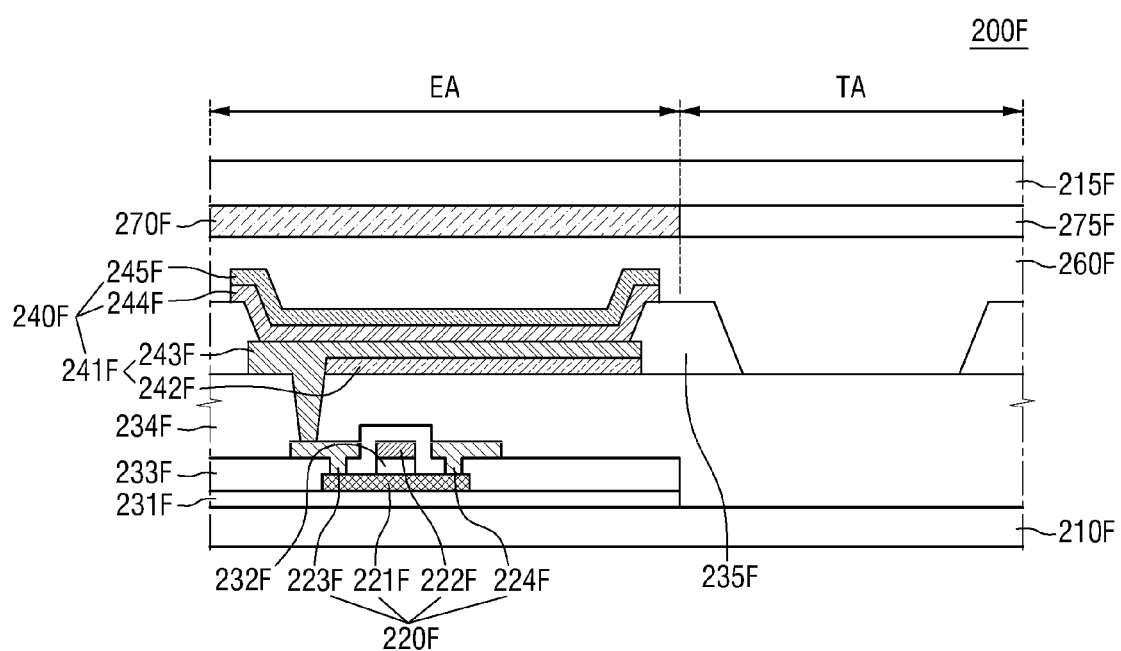

FIG. 2F is a cross-sectional view illustrating a transparent organic light emitting display device according to another embodiment of the inventive concept. A first substrate 210F, a thin film transistor, a buffer layer 231E, a gate insulating layer 232F, an interlayer insulating layer 233F, an overcoating layer 234F, an organic light emitting element 240F, a bank layer 235F, a color filter 270F, and a second substrate 215F illustrated in FIG. 2F are substantially the same as those of FIG. 2D, and thus repeated description will be omitted In a transmissive area TA of the second substrate 215F, the color filter 270F is not formed, but a transparent resin layer 275F may be formed. The transparent resin layer 275F is formed to the same thickness as the color filter 270F to remove a step on the second substrate 215F.

An encapsulating layer 260F is formed between the first substrate 110F and the second substrate 115F. The encapsulating layer 260F may protect internal elements of the transparent organic light emitting display device 200F such as a thin film transistor and an organic light emitting element 240F from moisture, air, and a shock from the outside. The encapsulating layer 260F may be referred to as an encapsulant, an encapsulating member, a sealing layer, or a sealing member. Specifically, the encapsulating layer 260F may be formed between the organic light emitting element 240F and the overcoating layer 234F formed in the first substrate 210F and the transparent resin layer 275E and the color filter 270F formed in the second substrate 215F. As the encapsulating layer 260F, a thin film encapsulation may be used.

Figure 3A:
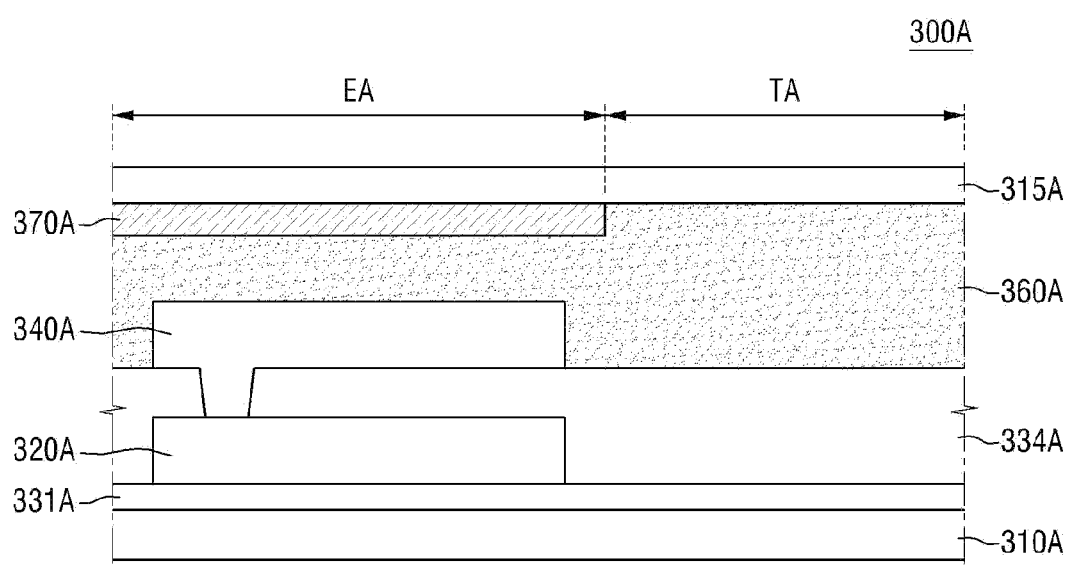
FIGS. 3A to 3C are conceptual diagrams illustrating transparent organic light emitting display devices in accordance with various embodiments of the inventive concept.

FIG. 3A is a cross-sectional view illustrating a transparent organic light emitting display device according to another embodiment of the inventive concept. Referring to FIG. 3A, a transparent organic light emitting display device 300A includes a first substrate 310A, a buffer layer 331A, a thin film transistor 320A, an overcoating layer 334A, an organic light emitting element 340A, a color filter 370A, and a second substrate 315A. The first substrate 310A, the buffer layer 331A, an overcoating layer 334A, the color filter 370A, and the second substrate 315A are substantially the same as those of FIG. 1C, and thus repeated description will be omitted. Although the thin film transistor 320A and the organic light emitting element 340A has been conceptually illustrated in FIG. 3A, the thin film transistor 320A and the organic light emitting element 340A are substantially the same as those of FIG. 1C, and thus repeated description thereof will be omitted.

A plurality of insulating layers may be formed between the transmissive TA of the first substrate 310A and the second substrate 315A, and the plurality of insulating layers may include at least two among the buffer layer, the gate insulating layer, the interlayer insulating layer, the overcoating layer, and a passivation layer. Referring to FIG. 3A, the plurality of insulating layers include the buffer layer 331A and the overcoating layer 334A.

The buffer layer 331A and the overcoating layer 334A included in the plurality of insulating layers may have substantially the same refractive indexes. Specifically, when the first substrate 310A includes glass, a refractive index of the first substrate 310A is 1.5. When the buffer layer 331A includes a silicon oxide film, a refractive index of the buffer layer 331A is 1.45. When the overcoating layer 334A may be formed of PAC, a refractive index of the overcoating layer 334A is 1.5. Therefore, since the refractive indexes of the buffer layer 331A and the overcoating layer 334A substantially coincide with the first substrate 310A, distortion such as total reflection of light in the interfaces between the first substrate 310A and the overcoating layer 334A and between the buffer layer 331A and the overcoating layer 334A may be minimized in the transmission area TA of the transparent organic light emitting display device 300A.

Figure 3B:
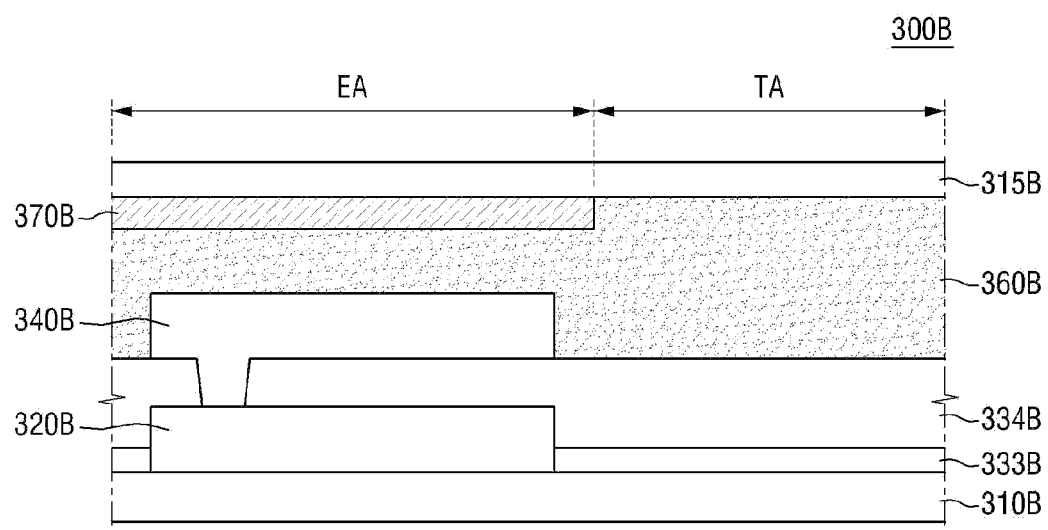

FIG. 3B is a cross-sectional view illustrating a transparent organic light emitting display device according to another embodiment of the inventive concept. Elements illustrated in FIGS. 3A and 3B are substantially the same when numbers are the same in the reference numeral other than alphabet, and thus repeated description thereof will be omitted.

A plurality of insulating layers may be formed between the transmissive TA of the first substrate 310B and the second substrate 315B, and the plurality of insulating layers may include at least two among a buffer layer, a gate insulating layer, an interlayer insulating layer, an overcoating layer, and a passivation layer. Referring to FIG. 3B, the plurality of insulating layers include an interlayer insulating layer 333B and the overcoating layer 334B.

The interlayer insulating layer 333B and the overcoating layer 334B included in the plurality of insulating layers may have the refractive indexes which substantially coincide with the first substrate 310B. Specifically, when the first substrate 310B includes glass, a refractive index of the first substrate 310B is 1.5. When the interlayer insulating layer 333B includes a silicon oxide film, a refractive index of the interlayer insulating layer 333B is 1.45. When the overcoating layer 334A may be formed of PAC, a refractive index of the overcoating layer 334A is 1.5. Therefore, since the refractive indexes of the interlayer insulating layer 333B and the overcoating layer 334A substantially coincide with that of the first substrate 310B, distortion such as total reflection of light in the interfaces between the first substrate 310B and the overcoating layer 134B and between the interlayer insulating layer 333B and the overcoating layer 331B may be minimized in the transmission area TA of the transparent organic light emitting display device 300B.

Figure 3C:
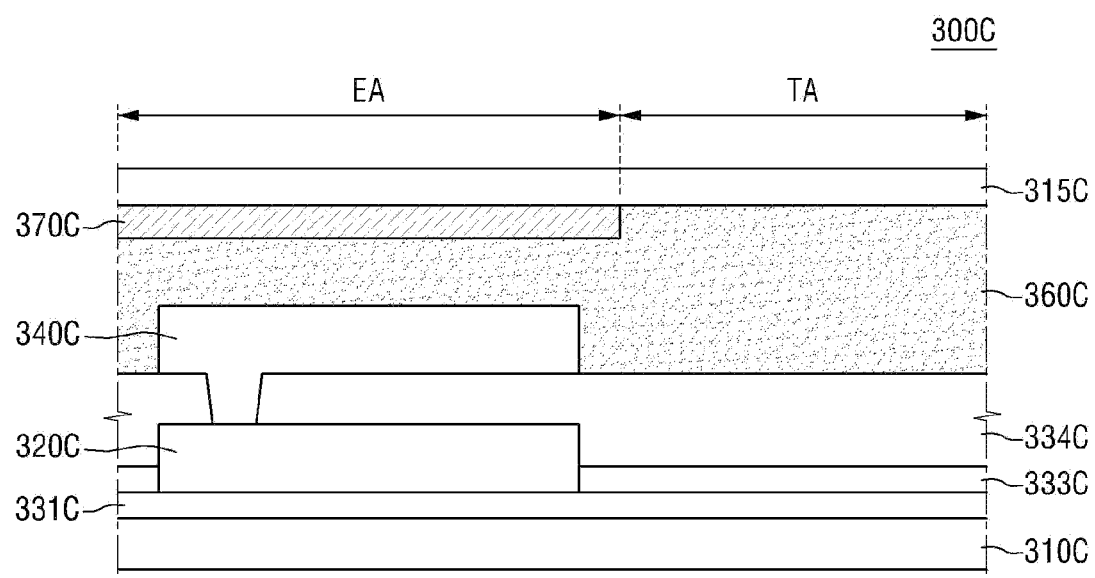

FIG. 3C is a cross-sectional view illustrating a transparent organic light emitting display device according to another embodiment of the inventive concept. Elements illustrated in FIGS. 3A, 3B, and 3C are substantially the same when numbers are the same in the reference numeral other than alphabet, and thus repeated description thereof will be omitted.

A plurality of insulating layers may be formed between the transmissive TA of the first substrate 310C and the second substrate 315C, and the plurality of insulating layers may include at least two among a buffer layer, a gate insulating layer, an interlayer insulating layer, an overcoating layer, and a passivation layer. Referring to FIG. 3C, the plurality of insulating layers include, a buffer layer 331C, an interlayer insulating layer 333C and an overcoating layer 334C.

The buffer layer 331C, the interlayer insulating layer 333C, and the overcoating layer 334C included in the plurality of insulating layers may have the refractive indexes which substantially coincide with that of the first substrate 310C. Specifically, when the first substrate 310C includes glass, a refractive index of the first substrate 310C is 1.5. When the buffer layer 331C includes a silicon oxide film, a refractive index of the buffer layer 331C is 1.45. When the interlayer insulating layer 333C includes a silicon oxide film, a refractive index of the interlayer insulating layer 333C is 1.45. When the overcoating layer 334C may be formed of PAC, a refractive index of the overcoating layer 334C is 1.5. Therefore, since the refractive indexes of the buffer layer 331C, the interlayer insulating layer 333C and the overcoating layer 334C substantially coincide with that of the first substrate 310C, distortion such as total reflection of light in the interfaces among the first substrate 310C, the buffer layer 331, the interlayer insulating layer 333C, and the overcoating layer 334C may be minimized in the transmission area TA of the transparent organic light emitting display device 300C.

Figure 4:
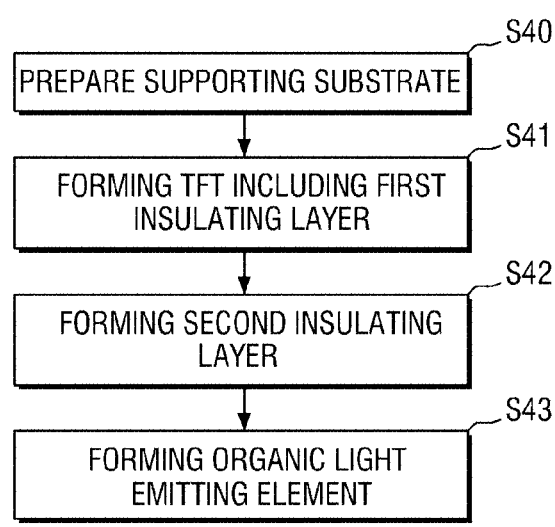
FIG. 4 is a flowchart illustrating a method for manufacturing a transparent organic light emitting display device in accordance with an embodiment of the inventive concept.

FIG. 4 is a flowchart illustrating a method for manufacturing a transparent organic light emitting display device according to an embodiment of the inventive concept. FIGS. 5A to 5D are cross-sectional views illustrating respective parts of an exemplary embodiment of transparent organic light emitting display device during each step of exemplary method for manufacturing the exemplary transparent light emitting display device.

First, a supporting substrate including a sub pixel region having a first region and a second region is provided (S40), and a thin film transistor including a first insulating layer is formed (S41). The preparing of the supporting substrate and the forming of the thin film transistor including the first insulating layer will be described in detail with reference to FIGS. 5A and 5B.

Figure 5A:
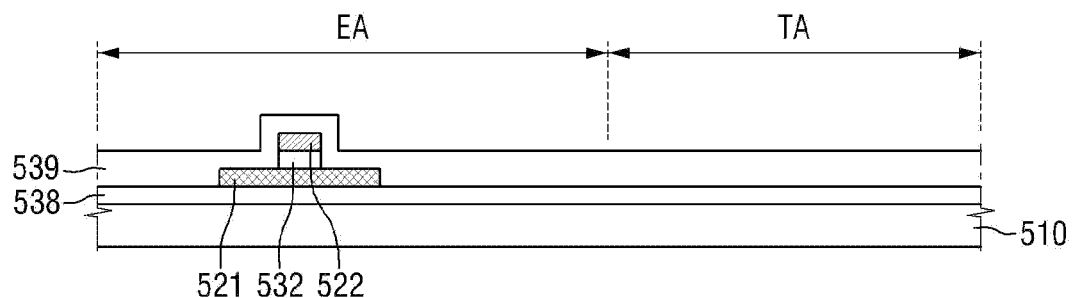
FIGS. 5A to 5D are processional cross-sectional views illustrating a method for manufacturing a transparent organic light emitting display device in accordance with an embodiment of the inventive concept.

Referring to FIG. 5A, a supporting substrate 510 having a first area EA as an emissive area EA and a second area TA as a transmissive area TA is provided as the supporting substrate 510, and a material 538 for a buffer layer is formed on the first substrate 510. The material 538 for a buffer layer may be formed both in the first area EA and in the second area TA. After the material 538 for a buffer layer, an active layer 521, a gate insulating layer 532, and a gate electrode 522 are sequentially formed in the first area EA, and then a material 539 for an interlayer insulating layer is formed on the gate electrode 522.

Figure 5B:
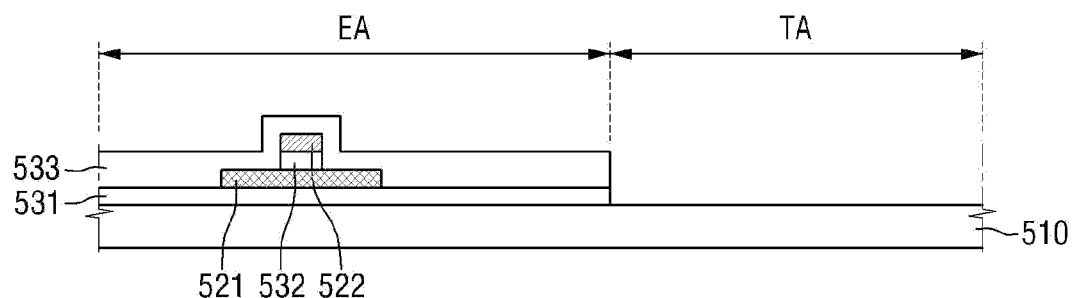

Referring to FIG. 5B, the material 538 for a buffer layer and the material 539 for an interlayer insulating layer formed in the second area TA are patterned to remove the material 538 for a buffer layer and the material 539 for an interlayer insulating layer formed in the second area TA, and to form an insulating layer including a buffer layer 531 and an interlayer insulating layer 533 formed in the first area EA. A first insulating layer included in the thin film transistor may be the buffer layer 531 and the interlayer insulating layer 533. The removing of the material 538 for a buffer layer and the material 539 for an interlayer insulating layer formed in the second area TA may include dry etching the material 538 for a buffer layer and the material 539 for an interlayer insulating layer formed in the second area TA. The removing of the material 538 for a buffer layer and the material 539 for an interlayer insulating layer formed in the second area TA may include forming an opening in the material 538 for a buffer layer and the material 539 for an interlayer insulating layer formed in the second area TA. After the material 538 for a buffer layer and the material 539 for an interlayer insulating layer formed in the second area TA are removed, a source electrode 523 and a drain electrode 524 electrically connected to an active layer 521 may be formed. The supporting substrate 510, a thin film transistor, the buffer layer 531, and the interlayer insulating layer 533 are substantially the same as those in FIG. 1C, and thus repeated description thereof may be omitted.

Subsequently, a second insulating layer is formed on the first area and the second area (S42). The forming of the second insulating layer will be described in detail with reference to FIG. 5C.

Figure 5C:
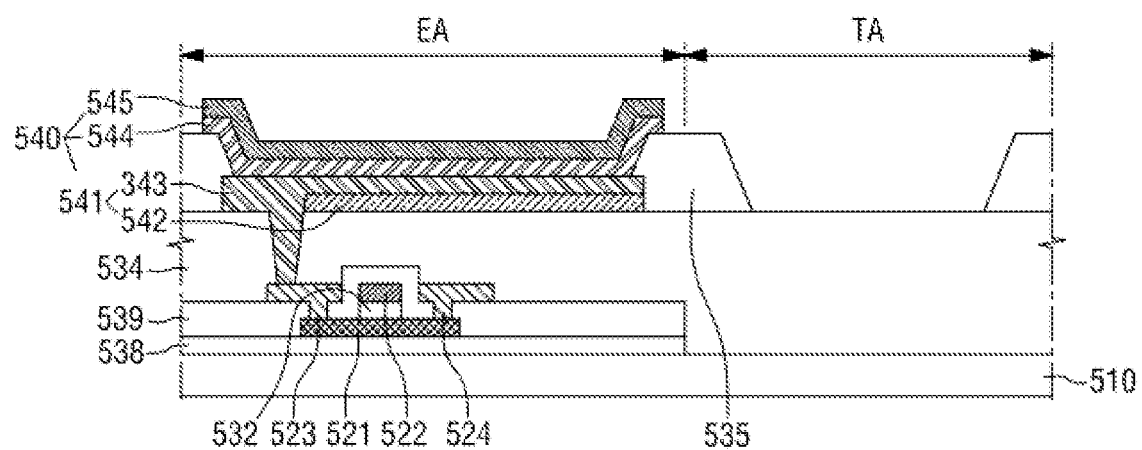

Referring to FIG. 5C, an overcoating layer 534 as the second insulating layer is formed on an entire surface of the supporting substrate 510 including the source electrode 523 and the drain electrode 524. The forming of the overcoating layer 534 may include forming the overcoating layer 534 on the insulating layer in the first area EA, and forming the overcoating layer 534 to be in contact with the supporting substrate 510 in the second area TA. Herein, the forming of the overcoating layer 534 in the second area TA includes forming the overcoating layer 534 to fill the opening formed in the material 538 for a buffer layer and the material 539. The overcoating layer 534 is substantially the same as that illustrated in FIG. 1C, and thus repeated description thereof may be omitted.

Subsequently, an organic light-emitting element is formed on the overcoating layer (S43). The forming of the organic light-emitting element will be described in detail with reference to FIG. 5D.

Figure 5D:
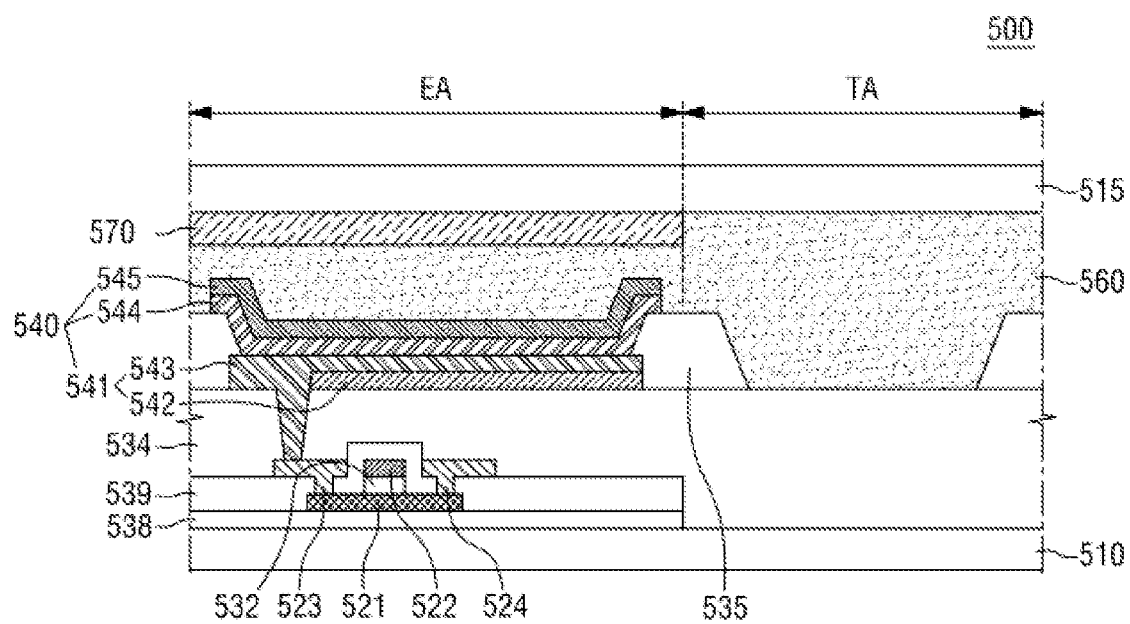

Referring to FIG. 5D, the forming of the organic light emitting element 540 includes forming a contact hole connecting an anode 541 and the source electrode 523 in the overcoating layer 534, and sequentially forming the anode 541 including a reflection layer 542 and a transparent conductive layer 543, an organic light emitting layer 544, and a cathode 545 on the overcoating layer 534 of the first area EA. The organic light emitting element 540 is substantially the same as that illustrated in FIG. 1C, and thus repeated description thereof may be omitted.

Subsequently, a second substrate 515 is formed to face the first substrate 510, and a color filter 570 is formed on a region of the second substrate 515 corresponding to the first area EA.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A transparent organic light emitting display device comprising:
 a first substrate having a plurality of pixel regions, each pixel region including an emissive area configured to form an image and a transmissive area configured to pass through an external light;
 a thin film transistor (TFT) disposed in the emissive area;
 an organic light emitting element disposed in the emissive area, the organic light emitting element being electrically connected to the TFT disposed in the emissive area;
 a plurality of insulating layers in the emissive area, wherein at least one of the plurality of insulating layers is extended into the transmissive area and at least a part of the insulating layer being extended into the transmissive area has substantially the same refractive index as the first substrate; and
 a plurality of banks, wherein each pixel region includes a first bank and a second bank from the plurality of banks, the first bank dividing the emissive area and the transmissive area of the pixel region, and the second bank dividing the pixel region from an adjacent pixel region, and wherein the transmissive area of each pixel region located between the first bank and the second bank passes through the external light.

2. The transparent organic light emitting display device of claim 1, wherein said at least one of the plurality of insulating layers being extended into the transmissive area is any one of a gate insulating layer, an interlayer insulating layer, a passivation layer, an overcoating layer and a buffer layer.

3. The transparent organic light emitting display device of claim 1, wherein said at least one of the plurality of insulating layers being extended into the transmissive area has a multilayered structure, and wherein the multilayered structure includes at least one layer contained within the emissive area and at least one layer extended into the transmissive area.

4. The transparent organic light emitting display device of claim 3, wherein said at least one insulating layer being extended into the transmissive area is interposed between the TFT and the first substrate.

5. The transparent organic light emitting display device of claim 4, wherein the TFT disposed on the substrate is a coplanar TFT with an oxide semiconductor layer, and wherein a layer of the multilayered structure in contact with the oxide semiconductor layer is extended into the transmissive area from the emissive area and does not include silicon nitride.

6. The transparent organic light emitting display device of claim 3, wherein the TFT disposed on the substrate is an inverted-staggered TFT having an oxide semiconductor layer disposed on a gate electrode, said multilayered structure being interposed between the gate electrode and the oxide semiconductor layer, and wherein a layer of the multilayered structure in contact with the oxide semiconductor layer is extended into the transmissive area and does not include silicon nitride.

7. The transparent organic light emitting display device of claim 3, further comprising a second substrate, wherein the first substrate, said at least one layer of the multilayered structure extended into the transmissive area and the second substrate all have substantially the same refractive index with respect to each other.

8. The transparent organic light emitting display device of claim 3, further comprising an encapsulating layer covering the organic light emitting element, said encapsulating layer being disposed on at least part of the emissive area and at least part of the transmissive area, wherein the first substrate, the encapsulating layer and said at least one layer of the multilayered structure extended into the transmissive area have substantially the same refractive index.

9. The transparent organic light emitting display device of claim 8, wherein the organic light emitting element comprises an anode, an organic light emitting layer configured to emit white light, and a cathode, and wherein the organic light emitting display device further comprises a color filter for filtering the white light to form colored light.

10. A transparent organic light emitting display device comprising:
 a substrate having a plurality of sub pixel regions, each of the plurality of sub pixel regions having an emissive area configured to form an image and a transmissive area configured to pass through an external light, and a driving circuit region configured to supply driving signals to each sub pixel region;
 a first insulating layer on the substrate;
 a thin film transistor (TFT) disposed on the first insulating layer in the emissive area, the TFT having a gate electrode, a second insulating layer, a source electrode, a drain electrode and an active layer;
 a third insulating layer disposed on the TFT;
 an organic light emitting element disposed on the second insulating layer in the emissive area; and
 an encapsulation layer disposed on the organic light emitting element; and a plurality of banks, wherein each sub pixel region includes a first bank and a second bank from the plurality of banks, the first bank dividing the emissive area and the transmissive area of the sub pixel region, and the second bank dividing the sub pixel region from an adjacent sub pixel region, and wherein the transmissive area of each sub pixel region located between the first bank and the second bank passes through the external light;

wherein at least one of the first, second and third insulating layers has a refractive index that differs from a refractive index of the substrate by more than a predetermined value, and contained within the emissive area of the sub pixel region.

11. The transparent organic light emitting display device of claim 10, wherein at least one of the first, second and third insulating layers has a refractive index that is substantially the same as that of the substrate, and is extended into the transmissive area from the emissive area of the sub pixel region.

12. The transparent organic light emitting display device of claim 10, wherein at least one of the first, second and third insulating layers is a multilayered structure including at least one layer that has substantially the same refractive index as the substrate and at least one layer with a refractive index differing from the substrate by more than the predetermined threshold value, and wherein said at least one layer with the different refractive index from the substrate is contained within the emissive area of the sub pixel region.

13. The transparent organic light emitting display device of claim 10, wherein the third insulating layer has a refractive index substantially the same as that of the substrate, and is extended into the transmissive area from the emissive area of the sub pixel region.

14. The transparent organic light emitting display device of claim 13, wherein the third insulating layer is one of an overcoating layer and a passivation layer.

15. The transparent organic light emitting display device of claim 11, wherein a refractive index of the encapsulating layer differs from that of the substrate and that of the insulating layer being extended into the transmissive area by less than a predetermined value.

* * * * *